(12) United States Patent
Hayashi et al.

(10) Patent No.: US 8,592,931 B2
(45) Date of Patent: Nov. 26, 2013

(54) PHOTOELECTRIC CONVERSION ELEMENT AND SOLID-STATE IMAGING DEVICE

(75) Inventors: Masayuki Hayashi, Kanagawa (JP); Fumito Nariyuki, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 395 days.

(21) Appl. No.: 12/361,661

(22) Filed: Jan. 29, 2009

(65) Prior Publication Data

US 2009/0188547 A1 Jul. 30, 2009

(30) Foreign Application Priority Data

Jan. 30, 2008 (JP) ................................ 2008-018879

(51) Int. Cl.
*H01L 27/14* (2006.01)
*H01L 31/00* (2006.01)

(52) U.S. Cl.
USPC .................... 257/431; 257/440; 257/E31.127

(58) Field of Classification Search
USPC ........... 257/440, E27.133, E27.135, E27.138, 257/431, 432, E31.127; 438/57, 73, 74
See application file for complete search history.

(56) References Cited

U.S. PATENT DOCUMENTS

| | | | | | |
|---|---|---|---|---|---|
| 4,236,829 | A | * | 12/1980 | Chikamura et al. | 257/183.1 |
| 4,900,975 | A | * | 2/1990 | Shimomoto et al. | 313/366 |
| 5,178,980 | A | * | 1/1993 | Mort et al. | 430/58.05 |
| 6,692,820 | B2 | * | 2/2004 | Forrest et al. | 428/212 |
| 7,579,665 | B2 | * | 8/2009 | Yokoyama et al. | 257/440 |
| 2001/0025933 | A1 | * | 10/2001 | Imai | 250/580 |
| 2001/0029070 | A1 | * | 10/2001 | Yamazaki et al. | 438/149 |
| 2002/0006986 | A1 | * | 1/2002 | Igarashi | 523/444 |
| 2003/0010943 | A1 | * | 1/2003 | Imai | 250/580 |
| 2004/0008326 | A1 | * | 1/2004 | Koide | 353/99 |
| 2004/0070946 | A1 | * | 4/2004 | Matsuo et al. | 361/709 |
| 2004/0124769 | A1 | * | 7/2004 | Ise et al. | 313/504 |
| 2004/0187911 | A1 | * | 9/2004 | Gaudiana et al. | 136/252 |
| 2004/0214041 | A1 | * | 10/2004 | Lu et al. | 428/690 |
| 2006/0054987 | A1 | * | 3/2006 | Nii | 257/440 |
| 2006/0222978 | A1 | * | 10/2006 | Tong et al. | 430/64 |
| 2006/0249202 | A1 | * | 11/2006 | Yoo et al. | 136/263 |
| 2006/0273362 | A1 | * | 12/2006 | Osaka et al. | 257/292 |
| 2006/0279190 | A1 | * | 12/2006 | Nakayama | 313/113 |

(Continued)

FOREIGN PATENT DOCUMENTS

| | | |
|---|---|---|
| JP | 56-152280 A | 11/1981 |
| JP | 59-229860 A | 12/1984 |
| JP | 5-129576 A | 5/1993 |

(Continued)

OTHER PUBLICATIONS

Office Action dated Mar. 12, 2013 in Japanese Application No. 2008-018879.
Office Action dated Sep. 3, 2013 issued by the Japanese Patent Office in counterpart Japanese Application No. 2008-018879 Partial.

*Primary Examiner* — Hoai V Pham
(74) *Attorney, Agent, or Firm* — Sughrue Mion, PLLC

(57) ABSTRACT

A photoelectric conversion element is provided and includes: a pair of electrodes; a photoelectric conversion layer between the pair of electrodes; and a charge-blocking layer between one of the pair of the electrodes and the photoelectric conversion layer. The charge-blocking layer is capable of suppressing injection of a charge from the one of the pair of electrodes into the photoelectric conversion layer upon application of a voltage across the pair of electrodes, and the charge-blocking layer contains an insulating material and an electrically conductive material.

9 Claims, 5 Drawing Sheets

(56) References Cited

U.S. PATENT DOCUMENTS

| | | | |
|---|---|---|---|
| 2006/0284230 A1* | 12/2006 | Yang et al. | 257/306 |
| 2007/0012955 A1* | 1/2007 | Ihama | 257/233 |
| 2007/0052051 A1* | 3/2007 | Osaka et al. | 257/440 |
| 2007/0063156 A1 | 3/2007 | Hayashi | |
| 2007/0075389 A1* | 4/2007 | Misawa | 257/440 |
| 2007/0077690 A1* | 4/2007 | Pei et al. | 438/149 |
| 2007/0125419 A1* | 6/2007 | Gui et al. | 136/252 |

FOREIGN PATENT DOCUMENTS

| | | |
|---|---|---|
| JP | 2002-231834 A | 8/2002 |
| JP | 2006-156555 A | 6/2006 |
| JP | 2007-12982 A | 1/2007 |
| JP | 2007-88033 A | 4/2007 |

* cited by examiner

PHOTOELECTRIC CONVERSION ELEMENT AND SOLID-STATE IMAGING DEVICE

This application is based on and claims priority under 35 U.S.C. §119 from Japanese Patent Application No. 2008-018879 filed Jan. 30, 2008, the entire disclosure of which is herein incorporated by reference.

BACKGROUND OF THE INVENTION

1. Field of the Invention

The present invention relates to a photoelectric conversion element equipped with a lower electrode, an upper electrode facing the lower electrode, and an organic photoelectric conversion layer formed between the lower electrode and the upper electrode, and to a solid-state imaging device.

2. Description of Related Art

With organic thin film solar cells, their performance is evaluated without applying thereto an external electric field, since their purpose is to produce electric power from them. However, with organic photoelectric conversion elements which are required to provide maximum photoelectric conversion efficiency, such as an image input element or a photosensor, an external voltage is in many cases applied thereto for improving photoelectric conversion efficiency and response speed. In such cases, dark current increases due to hole injection or electron injection from an electrode by application of the external electric field, thus an element having a large photo current/dark current ratio not having been obtained. Therefore, a technology of suppressing dark current without reducing photo current can be said to be one of the key technologies of the photoelectric conversion element.

It has been known to suppress dark current by inserting between an electrode and a photoelectric conversion layer a blocking layer which functions as a Schottky barrier for carrier injection (dark current) from the electrode. With this method, in order to suppress carrier injection from the electrode upon application of an external electric field, a material capable of enlarging the Schottky barrier against the electrode as much as possible is used for the blocking layer. As the material for the blocking layer, silicon dioxide, silicon monoxide, and the like are known. As known photoelectric conversion elements equipped with the blocking layer, there are illustrated, for example, those described in JP-A-59-229860 and JP-A-5-129576.

Incidentally, use of silicon dioxide as a material for a blocking layer provides enough high insulating properties to suppress dark current, but has involved the problem of reduction in photoelectric conversion efficiency since silicon dioxide inhibits carriers generated by photoelectric conversion as well. Also, in the case of using silicon monoxide, it provides a smaller effect of suppressing dark current due to its higher electrical conductivity than silicon dioxide, though the reduction in photoelectric conversion is small, thus having failed to provide a sufficient S/N ratio.

In order to solve such problems, there has been known a method of inserting an insulating layer as a blocking layer between the electrode and the photoelectric conversion layer to thereby suppress dark current by carrier injection from the electrode.

For example, in JP-A-59-229860, it is described that dark current can be reduced by disposing an insulating film comprising silicon dioxide (partly containing silicon monoxide) between the electrode and the photoelectric conversion layer through a sputtering method or through oxidation of silicon. However, though dark current is truly suppressed by increasing the thickness of the insulating film, the thick insulating layer inhibits read-out of signal carriers as well, thus there results reduced photoelectric conversion efficiency. On the other hand, when the thickness of the insulating film is small, sufficient effect of suppressing dark current is unable to be obtained though reduction in the photoelectric conversion efficiency is lowered. In either case, sufficient S/N ratio is not obtained. Also, in the case of using a highly insulating film, there has involved another problem that there occurs response speed delay. As the reason for this, accumulation of signal carriers at the interface of the insulating layer or in the insulating layer can be considered, but sufficient countermeasures have not been proposed.

Also, in JP-A-5-129576, a comparatively rapid response speed can be obtained with suppressing reduction in the photoelectric conversion efficiency, by using silicon monoxide having a comparatively high electric conductivity but, since insulating properties of silicon monoxide are less sufficient in comparison with silicon dioxide or the like, high S/N ratio is unable to be obtained.

SUMMARY OF THE INVENTION

An object of an illustrative, non-limiting embodiment of the invention is to provide a photoelectric conversion element which can provide both sufficient dark current-suppressing effect and high photoelectric conversion efficiency, and a solid-state imaging device containing such elements.

The above-described object can be attained by the following constitutions.

(1) A photoelectric conversion element comprising:
   a pair of electrodes;
   a photoelectric conversion layer between the pair of electrodes; and
   a charge-blocking layer between one of the pair of the electrodes and the photoelectric conversion layer, wherein the charge-blocking layer is capable of suppressing injection of a charge from the one of the pair of electrodes into the photoelectric conversion layer upon application of a voltage across the pair of electrodes, and the charge-blocking layer contains an insulating material and an electrically conductive material.

(2) The photoelectric conversion element according to (1) above, wherein the charge-blocking layer blocks migration of an injected charge with the insulating material, and the electrically conductive material has a conductivity to carry a charge opposite to the injected charge.

(3) The photoelectric conversion element according to (1) or (2) above, wherein the insulating material constituting the charge-blocking layer includes an organic high molecular polymer.

(4) The photoelectric conversion element according to (1) or (2) above, wherein the insulating material constituting the charge-blocking layer includes one of, or a plurality of, inorganic oxides such as $SiO_2$, inorganic fluorides such as LiF, and inorganic nitrides such as silicon nitride.

(5) The photoelectric conversion element according to (1) or (2) above, wherein at least one electrically conductive material constituting the charge-blocking layer is an electron transporting material such as a perylene derivative or a carbon cluster such as fullerene C60, fullerene C70 or fullerene oxide, or a derivative thereof.

(6) The photoelectric conversion element according to (1) or (2) above, wherein at least one electrically conductive material constituting the charge-blocking layer is one electron transporting material represented by the following formula (A-1) or (B-1):

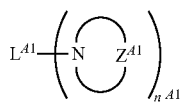

Formula (A-1)

wherein $L^{A1}$ represents a linking group, $Z^{A1}$ represents a group of atoms necessary for forming a nitrogen-containing hetero ring, and $n^{A1}$ represents an integer of 2 or more, provided that a compound represented by the formula (A-1) contains at least 3 or more nitrogen atoms within the molecule;

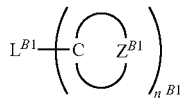

Formula (B-1)

wherein $L^{B1}$ represents a linking group, $Z^{B1}$ represents a group of atoms necessary for forming an aromatic hydrocarbon ring or aromatic hetero ring, and $n^{B1}$ represents an integer of 2 or more, provided that a compound represented by the formula (B-1) contains at least 3 or more nitrogen atoms within the molecule.

(7) The photoelectric conversion element according to (1) or (2) above, wherein the electrically conductive material constituting the charge-blocking layer is a hole transporting material such as pentacene or a derivative thereof.

(8) The photoelectric conversion element according to any one of (1) to (7) above, wherein the thickness of the charge-blocking layer is from 10 nm to 200 nm.

(9) The photoelectric conversion element according to any one of (1) to (8) above, wherein the value obtained by dividing the voltage externally applied across the pair of electrodes by the distance between the pair of electrodes is from $1.0 \times 10^5$ V/cm to $1.0 \times 10^7$ V/cm.

(10) The photoelectric conversion element according to any one of (1) to (9) above, further comprising:
a semiconductor substrate above which a photoelectric conversion portion including the pair of electrodes, the photoelectric conversion layer, and the charge-blocking layer is stacked;
a charge accumulating portion provided within the semiconductor substrate and accumulating a charge generated in the photoelectric conversion layer; and
a connecting portion that electrically connects one of the pair of electrodes for collecting the charge to the charge accumulating portion.

(11) The photoelectric conversion element according to (10) above, further comprising an intra-substrate photoelectric conversion portion that is provided within the semiconductor substrate and that absorbs light transmitted through the photoelectric conversion layer and generates and accumulates a charge in proportion to an amount of the light.

(12) The photoelectric conversion element according to (11) above, wherein the intra-substrate photoelectric conversion portion comprises a plurality of photodiodes stacked within the semiconductor substrate and capable of absorbing light having different colors

(13) The photoelectric conversion element according to (11) above, wherein the intra-substrate photoelectric conversion portion comprises a plurality of photodiodes arranged in the vertical direction to the entering direction of the incident light within the semiconductor substrate and capable of absorbing light having different colors.

(14) The photoelectric conversion element according to (12) or (13) above, wherein
the number of the photoelectric conversion portion stacked above the semiconductor substrate is one,
the plurality of the photodiodes includes a photodiode for blue light having a pn junction plane at a position capable of absorbing light of a blue wavelength region and a photodiode for red light having a pn junction plane at a position capable of absorbing light of a red wavelength region, and
the photoelectric conversion layer of the photoelectric conversion portion is able to absorb light of a green wavelength region.

(15) A solid-state imaging device comprising:
a plurality of the photoelectric conversion elements described in any one of (10) to (14) above in an array form; and
a signal read-out portion that reads out signals each corresponding to the charge having been accumulated in each charge accumulating portion of each of the plurality of photoelectric conversion elements.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

According to an exemplary embodiment of the invention, a pair of electrodes is provided with a charge-blocking layer being provided between one of the pair of electrodes and a photoelectric conversion layer, the charge-blocking layer containing both an insulating material and an electrically conductive material. Incident light is to be introduced from one side of the pair of electrodes to generate signal charge in the photoelectric conversion portion and, upon transporting the signal charge from the photoelectric conversion portion to the other electrode, the signal charge can be transported with the electrically conductive material contained in the charge-blocking layer. By employing such constitution, generation of dark current can be suppressed by suppressing migration of signal charge with the insulating material and, at the same time, photoelectric conversion efficiency can be improved by transporting the signal charge with the electrically conductive material.

According to an exemplary embodiment of the present invention, there can be provided a photoelectric conversion element and a solid-state imaging device which can provide both the effect of sufficiently suppressing dark current and the effect of providing high photoelectric conversion efficiency.

Exemplary embodiments of the present invention will be described below by reference to drawings.

(First Embodiment)

Figure 1A:
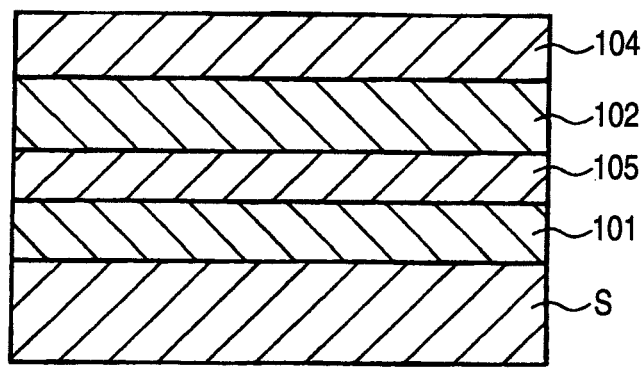
FIGS. 1A and 1B are cross-sectional views showing a first exemplary embodiment of the photoelectric conversion element.

FIG. 1A is a schematic cross-sectional view showing the fundamental structure of a photoelectric conversion element of a first exemplary embodiment of the invention. Also, FIG. 1B is a schematic cross-sectional view showing a modified example of the photoelectric conversion element of the first embodiment.

The photoelectric conversion element shown in FIG. 1A includes a substrate S, a lower electrode (pixel electrode) 101 formed on the substrate S, a hole-blocking layer 105 formed on the lower electrode 101, a photoelectric conversion layer 102 formed on the hole-blocking layer 105, and an upper electrode (opposing electrode) 104 formed on the photoelectric conversion layer 102. Also, the photoelectric conversion element shown by FIG. 1B includes a substrate S, a lower electrode (pixel electrode) 101 formed on the substrate S, an electron-blocking layer 103 formed on the lower electrode 101, a photoelectric conversion layer 102 formed on the electron-blocking layer 103, and an upper electrode (opposing electrode) 104 formed on the photoelectric conversion layer 102. In the following descriptions, the hole-blocking layer 105 and the electron-blocking layer 103 are also inclusively referred to as a charge-blocking layer.

Figure 1B:
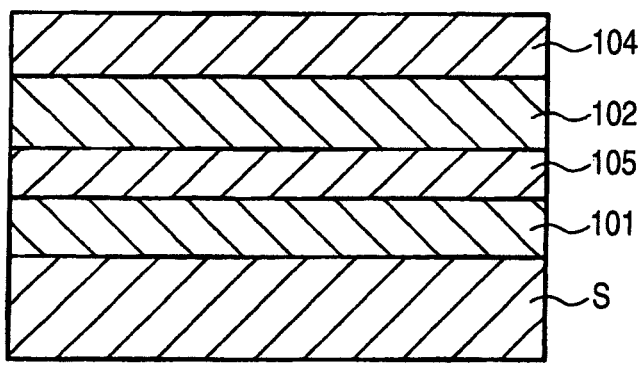

The photoelectric conversion element shown in FIG. 1 is designed to receive incident light from above the upper electrode 104. Also, the photoelectric conversion element shown in FIG. 1A is designed to apply a bias voltage across the lower electrode 101 and the upper electrode 104 so that, of the charges (holes and electrons) generated in the photoelectric conversion layer 102, holes can migrate to the upper electrode 104 and electrons can migrate to the lower electrode 101. That is, the upper electrode 104 is intended to function as an electrode for collecting holes, whereas the lower electrode 101 is intended to function as an electrode for collecting electrons. FIG. 1B shows a constitution wherein a bias voltage of the opposite direction to that in FIG. 1A is applied.

The upper electrode 104 is constituted by a transparent electrically conductive material since it is necessary to introduce light into the photoelectric conversion layer 102. Here, "transparent" means to transmit about 80% or more of visible light of from about 420 nm to about 660 nm in wavelength. As the transparent electrically conductive material, ITO is preferably used.

All that is required for the lower electrode 101 is that it is made of an electrically conductive material, and the lower electrode 101 is not required to be transparent. However, with the photoelectric conversion element shown in FIG. 1, there exists the case where it is necessary to transmit light as far as under the lower electrode 101 as will be described hereinafter, and hence the lower electrode 101 is preferably constituted by a transparent electrically conductive material as well. As is the same with the upper electrode 104, use of ITO is preferred with respect to the lower electrode 101 as well.

The photoelectric conversion layer 102 includes an organic material having the ability of photoelectric conversion. As the organic material, various organic semiconductor materials used in, for example, light-sensitive materials for electrophotography may be used. Of them, materials having a quinacridone structure or organic materials having a phthalocyanine structure are particularly preferred from the standpoints of high photoelectric conversion performance, excellent color separation upon producing spectral light, high durability against long-time irradiation with light, and excellent ease with respect to vacuum deposition.

In the case where quinacridone represented by the following chemical formula is used as the photoelectric conversion layer 102, it becomes possible for the photoelectric conversion layer 102 to absorb light of a green wavelength region and generate charge in proportion to the amount of absorbed light.

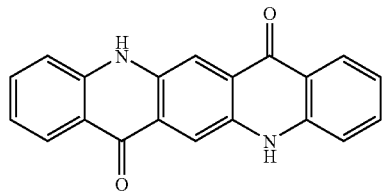 [SMILES: O=c1c2ccccc2[nH]c2cc3c(=O)c4ccccc4[nH]c3cc12]

In the case where zinc phthalocyanine represented by the following chemical formula is used as the photoelectric conversion layer 102, it becomes possible for the photoelectric conversion layer 102 to absorb light of a red wavelength region and generate charge in proportion to the amount of absorbed light.

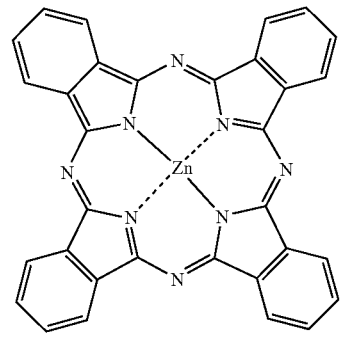

The organic material constituting the photoelectric conversion layer 102 preferably contains at least either of the organic p-type semiconductor and the organic n-type semiconductor. As the organic p-type semiconductor and the organic n-type semiconductor, any one of quinacridone derivatives, naphthalene derivatives, anthracene derivatives, phenanthrene derivatives, tethracene derivatives, pyrene derivatives, perylene derivatives, and fluoranthene derivatives can particularly preferably be used.

The organic p-type semiconductors (compounds) are donor organic semiconductors, are mainly represented by those organic compounds which transport holes, and are organic compounds having electron-donating properties. More particularly, when two organic compounds are used in contact with each other, the organic compound showing a smaller ionization potential is referred to as the organic p-type semiconductor. Therefore, any organic compound that has electron-donating properties can be used as the donor organic compound. For example, triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic hydrocarbon ring compounds (e.g., naphthalene derivatives, anthracene derivatives, phenanthrene derivatives, tethracene derivatives, pyrene derivatives, perylene derivatives, and fluoranthene derivatives), and metal complexes having as a ligand a nitrogen-containing hetero ring compound can be used. Additionally, these are not limitative and, as is described above, an organic compound having a smaller ionization potential than the organic compound used as an n-type (acceptor) compound may be used as the donor organic semiconductor.

The organic n-type semiconductors (compounds) are acceptor organic semiconductors (compounds), are mainly represented by those organic compounds which transport electrons, and are organic compounds having electron-accepting properties. More particularly, when two organic compounds are used in contact with each other, the organic compound showing a larger affinity for electron is referred to as the organic n-type semiconductor. Therefore, any organic compound that has electron-accepting properties can be used as the acceptor organic compound. For example, condensed aromatic hydrocarbon ring compounds (e.g., naphthalene derivatives, anthracene derivatives, phenenthrene derivatives, thetracene derivatives, pyrene derivatives, perylene derivatives, and fluoranthene derivatives), 5- to 7-membered hetero ring compounds containing nitrogen atom, oxygen atom or sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrazolidine, pyrrolopyridine, thiadiazolopyridine, dibenzazepine, tribenzazepine, etc.), polyarylene compounds, fluorine compounds, cyclopentadiene compounds, silyl compounds, and metal complexes having as a ligand a nitrogen-containing hetero ring compound are illustrated. Additionally, these are not limitative and, as is described above, an organic compound having a larger affinity for electron than the organic compound used as a donor organic compound may be used as the acceptor organic semiconductor.

As p-type organic dyes which can be used as a p-type organic semiconductor or n-type organic dyes which can be used as a n-type organic semiconductor, any dye may be used, but preferred examples thereof include cyanine dyes, styryl dyes, hemicyanine dyes, merocyanine dyes (including zero methine merocyanines (simple merocyanines)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squalium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugido dyes, perylene dyes, phenazine dyes, phenothiazine dyes, quinine dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, condensed aromatic hydrocarbon ring series dyes (naphthalene derivatives, anthracene derivatives, phenanthrene derivatives, tetracene derivatives, pyrene derivatives, perylene derivatives, and fluoranthene derivatives).

Next, the metal complex compounds will be described below. The metal complex compounds are metal complexes which have a ligand containing at least one nitrogen atom, oxygen atom or sulfur atom and coordinating to a metal. The metal ion in the metal complex is not particularly limited, but is preferably beryllium ion, magnesium ion, aluminum ion, gallium ion, zinc ion, indium ion, or tin ion, more preferably beryllium ion, aluminum ion, gallium ion, or zinc ion, still more preferably aluminum ion or zinc ion. As the ligand contained in the above-described metal complex, various publicly known ligands may be cited. For example, there are illustrated those ligands which are described in *Photochemistry and Photophysics of Coordination Compounds*, published by Springer-Verlag in 1987 and written by H. Yersin; and *Yuki Kinzoku Kagaku-Kiso to Oyo* published by Shokabo in 1982 and written by Akio Yamamoto.

The ligand is preferably a nitrogen-containing hetero ring ligand (containing preferably from 1 to 30 carbon atoms, more preferably from 2 to 20 carbon atoms, particularly preferably from 3 to 15 carbon atoms and may be a monodentate ligand or a ligand having two or more coordinating sites. The ligand is preferably a bidentate ligand. Examples thereof include a pyridine ligand, a bipyridyl ligand, a quinolinol ligand, a hydroxyphenylazole ligand (e.g., a hydroxyphenylbenzimidazole ligand, a hydroxyphenylbenzoxazole ligand or a hydroxyphenylimidazole ligand)), an alkoxy ligand (containing preferably from 1 to 30 carbon atoms, more preferably from 1 to 20 carbon atoms, particularly preferably from 1 to 10 carbon atoms, and being exemplified by methoxy, ethoxy, butoxy, and 2-ethylhexyloxy), an aryloxy ligand (containing preferably from 6 to 30 carbon atoms, more preferably from 6 to 20 carbon atoms, particularly preferably from 6 to 12 carbon atoms, and being exemplified by phenyloxy, 1-naphthyloxy, 2-nophtyloxy, 2,4,6-trimethylphenyloxy, and 4-biphenyloxy), a heteroaryloxy ligand (containing preferably from 1 to 30 carbon atoms, more preferably from 1 to 20 carbon atoms, particularly preferably from 1 to 12 carbon atoms, and being exemplified by pyridyloxy, pyrazyloxy, pyrimidyloxy, and quinolyloxy), an alkylthio ligand (containing preferably from 1 to 30 carbon atoms, more preferably from 1 to 20 carbon atoms, particularly preferably from 1 to 12 carbon atoms, and being exemplified by methylthio and ethylthio), an arylthio ligand (containing preferably from 6 to 30 carbon atoms, more preferably from 6 to 20 carbon atoms, particularly preferably from 6 to 12 carbon atoms, and being exemplified by phenylthio), a hetero ring-substituted thio ligand (containing preferably from 1 to 30 carbon atoms, more preferably from 1 to 20 carbon atoms, particularly preferably from 1 to 12 carbon atoms, and being exemplified by pyridylthio, 2-benzimidazolylthio, 2-benzoxazolylthio, and 2-benzothiazolylthio), or a siloxy ligand (containing preferably from 1 to 30 carbon atoms, more preferably from 3 to 25 carbon atoms, particularly preferably from 6 to 20 carbon atoms, and being exemplified by a triphenylsiloxy group, a triethoxysiloxy group, and a triisopropylsiloxy group), more preferably a nitrogen-containing hetero ring ligand, an aryloxy ligand, a heteroaryloxy ligand, or a siloxy ligand, sill more preferably a nitrogen-containing hetero ring ligand, an aryloxy ligand, or a siloxy ligand.

In this embodiment, the hole-blocking layer 105 in the photoelectric conversion element shown in FIG. 1A has a constitution of containing both an insulating material and an electrically conductive material. Also, the electron-blocking layer 103 in the photoelectric conversion element shown in FIG. 1B has a constitution of containing both an insulating material and an electrically conductive material. These charge-blocking layers function to block migration of injected charge with the insulating material and, at the same time, function as a carrier for a charge with reverse polarity to that of the injected charge. Next, candidate substances for constituting the electron-blocking layer 103 and the hole-blocking layer 105 will be described below.

First, the term "insulating material" as used herein means a material of $10^8$ Ωcm or more in volume resistivity, which is generally called "insulator" and, with some dark current levels required, a material with a lower volume resistivity than this may be used.

Also, the term "electrically conductive material" as used herein means a material of $10^8$ Ωcm or less in volume resistivity and, in order to transport signal charge generated in the photoelectric conversion layer, a material with a volume resistivity of $10^6$ Ωcm or less is preferred.

The insulating material constituting the electron-blocking layer 103 and the hole-blocking layer 105 preferably comprises an organic high molecular polymer. Such insulating organic high molecular polymer can be selected from among, for example, acrylic organic resins, polyimides, BCB, PVA, acryl, polyethylene, polycarbonates, polyimides, and polyetherimides. In particular, acrylic organic resins and polycarbonates are preferred, with bisphenol Z type polycarbonates, so-called polycarbonate Z (PCz), being particularly preferred.

Also, the insulating material constituting the charge-blocking layer may comprise one of, or a plurality of, an inorganic oxide such as $SiO_2$, an inorganic fluoride such as LiF, and an inorganic nitride such as silicon nitride.

(Hole-Blocking Layer)

As the electrically conductive material constituting the hole-blocking layer 105, an electron-transporting organic material can be used. For example, perylene derivatives, or carbon clusters or derivatives thereof such as fullerene C60, fullerene C70, and fullerene oxide are preferred.

The electron-transporting material is a material which blocks holes and passes electrons, and carbon clusters or the derivatives thereof can mainly be used. Here, the carbon cluster or a derivative thereof is an aggregate wherein several to several hundreds of carbon atoms are bound to each other through carbon-to-carbon bond regardless of the kind thereof and is not necessarily constituted 100% by carbon atoms but may contain in some cases other atoms or substituents. The carbon cluster to be used as the hole-blocking material contains, for example, one or several kinds of fullerenes.

The term "fullerenes" as used herein is a generic term for spherical or rugby ball-like carbon clusters comprising sp2 carbon atoms, and generally known ones include $C_{60}$, $C_{70}$, $C_{76}$, $C_{78}$, and $C_{84}$. In the invention, these may be used independently or as a mixture thereof. Preferably, a mixture of $C_{60}$ and $C_{70}$ can be used. Also, fullerene oxides obtained by oxidation of fullerenes can preferably be used. As such fullerene oxides, a mixture of $C_{60}(O)_1$, $C_{60}(O)_2$, $C_{60}(O)_3$, etc. can be used. Preferably, those compounds are preferred wherein oxygen substituents are collectively added according to regioselection rule, and those to which a functional group is added may also be used.

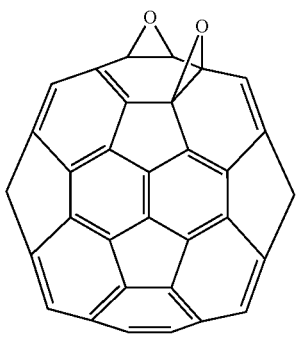

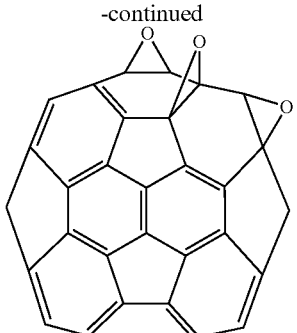

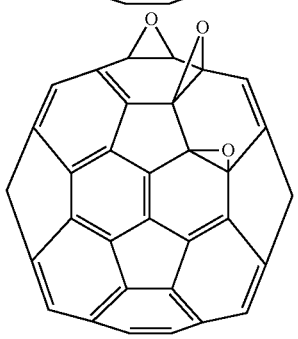

Also, as the electron-transporting material, compounds represented by the following formula (A-1) or (B-1) can preferably be used.

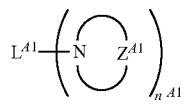

Formula (A-1)

In the formula (A-1), $L^{A1}$ represents a linking group, $Z^{A1}$ represents a group of atoms necessary for forming a nitrogen-containing hetero ring, and $n^{A1}$ represents an integer of 2 or more, provided that the compound represented by the formula (A-1) contains at least 3 or more nitrogen atoms within the molecule;

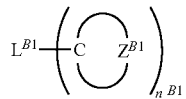

Formula (B-1)

In the formula (B-1), $L^{B1}$ represents a linking group, $Z^{B1}$ represents a group of atoms necessary for forming an aromatic hydrocarbon ring or aromatic hetero ring, and $n^{B1}$ represents an integer of 2 or more, provided that the compound represented by the formula (B-1) contains at least 3 or more nitrogen atoms within the molecule.

First, compounds represented by the formula (A-1) will be described below.

$L^{A1}$ in the formula (A-1) represents a linking group. As the linking group represented by $L^{A1}$, a linking group formed by carbon atom, silicon atom, nitrogen atom, phosphorus atom, sulfur atom, oxygen atom, boron atom, germanium atom, or the like is preferred as well as a single bond. As the linking group represented by $L^{A1}$, a single bond, a carbon atom, a silicon atom, a boron atom, an oxygen atom, a sulfur atom, a germanium atom, an aromatic hydrocarbon ring, and an aromatic hetero ring are more preferred; a carbon atom, a silicon atom, an aromatic hydrocarbon ring, and an aromatic hetero ring are still more preferred; an aromatic hydrocarbon ring having a valence of 2 or more, an aromatic hetero ring having a valence of 2 or more, and a carbon atom are still more preferred; an aromatic hydrocarbon ring having a valence of 2 or more and an aromatic hetero ring having a valence of 2 or more are yet more preferred; and a 1,3,5-benzenetriyl group, a 1,2,5,6-benzenetetrayl group, a 1,2,3,4,5,6-benzenehexayl group, a 2,2'-dimethyl-4,4'-biphenylene group, a 2,4,6-pyridinetriyl group, a 2,3,4,5,6-pyridinepentayl group, a 2,4,6-pyrimidinetriyl group, a 2,4,6-triazinetriyl group, and a 2,3,4,5-thiophenetetrayl group are particularly preferred. As specific examples of the linking group represented by $L^{A1}$, there are illustrated the following ones which, however, are not limitative at all.

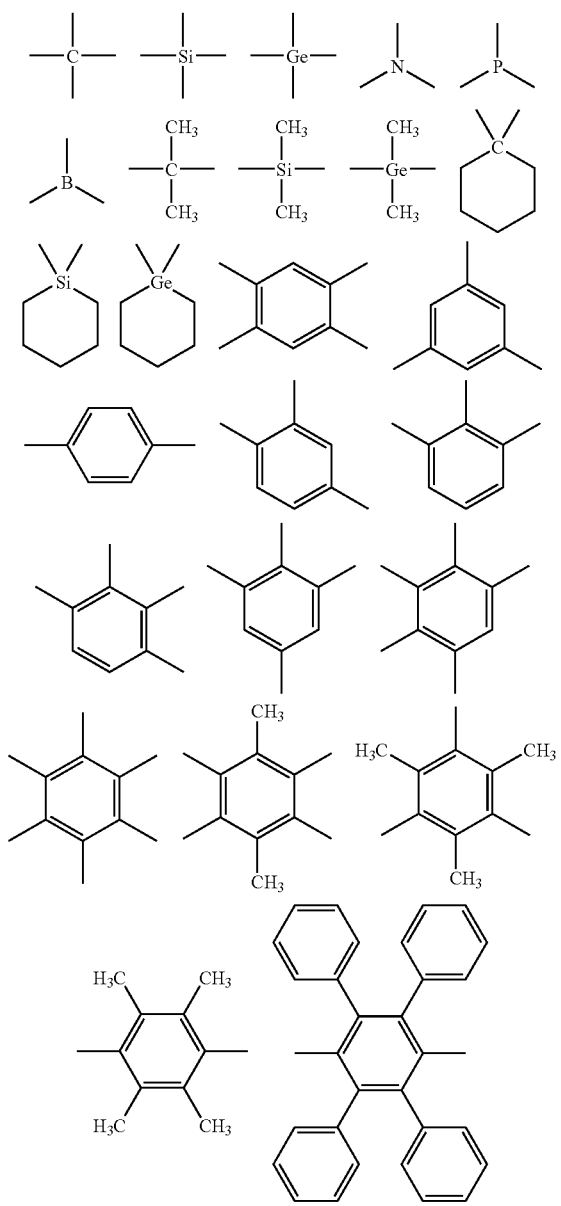

-continued

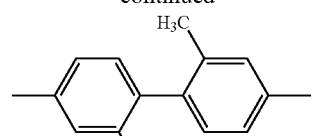

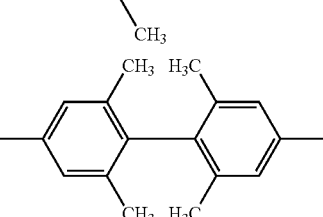

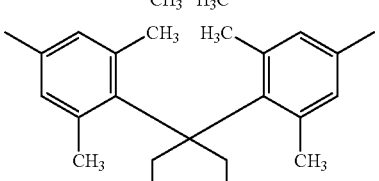

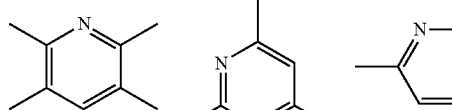

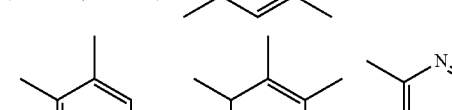

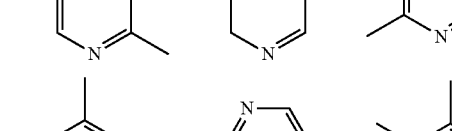

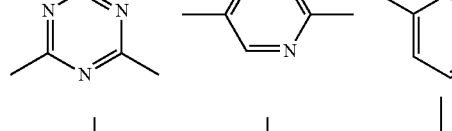

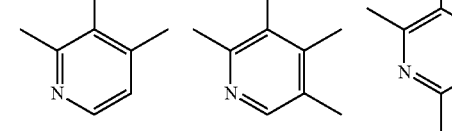

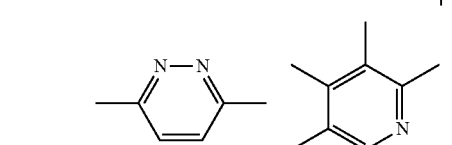

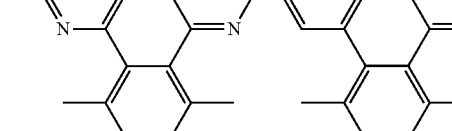

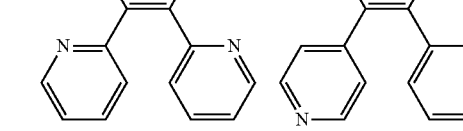

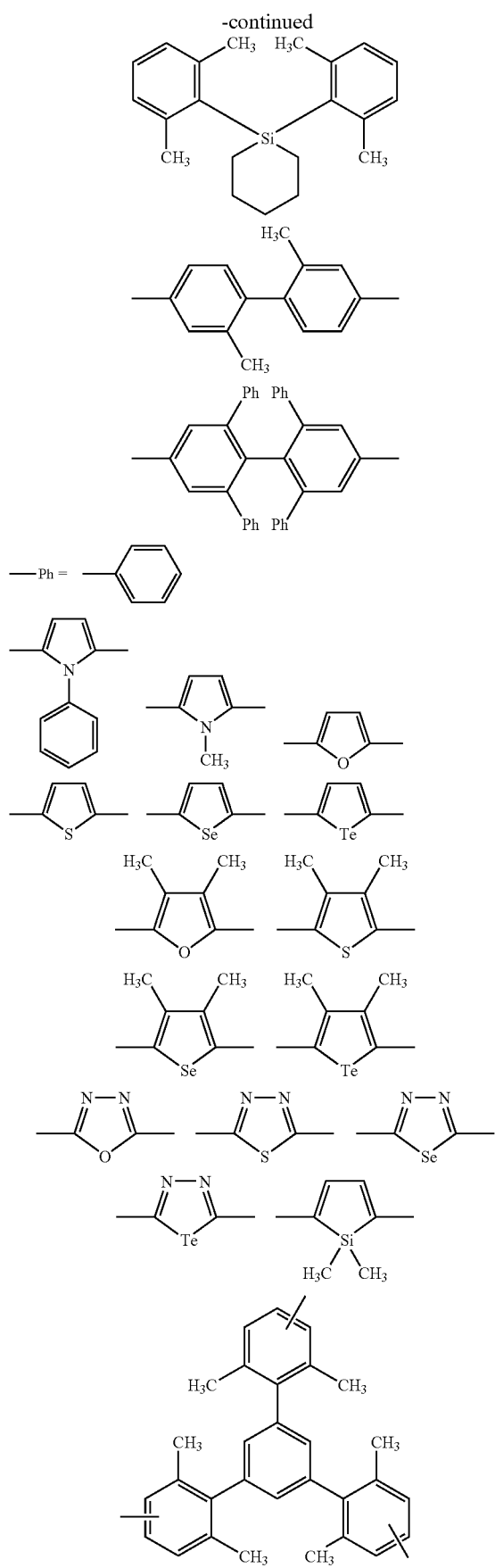

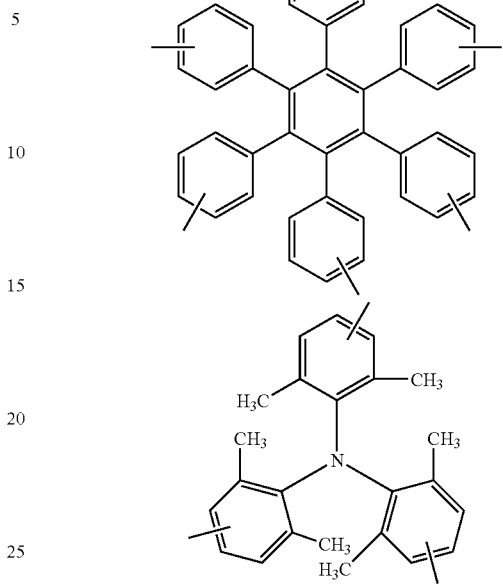

$L^{A1}$ may further have a substituent, and examples of a substituent which can be introduced include an alkyl group (containing preferably from 1 to 30 carbon atoms, more preferably from 1 to 20 carbon atoms, particularly preferably from 1 to 10 carbon atoms and being exemplified by methyl, ethyl, iso-propyl, tert-butyl, n-octyl, n-decyl, n-hexadecyl, cyclopropyl, cyclopentyl, and cyclohexyl), an alkenyl group (containing preferably from 2 to 30 carbon atoms, more preferably from 2 to 20 carbon atoms, particularly preferably from 2 to 10 carbon atoms and being exemplified by vinyl, allyl, 2-butenyl, and 3-pentenyl), an alkynyl group (containing preferably from 2 to 30 carbon atoms, more preferably from 2 to 20 carbon atoms, particularly preferably from 2 to 10 carbon atoms and being exemplified by propargyl and 3-pentynyl), an aryl group (containing preferably from 6 to 30 carbon atoms, more preferably from 6 to 20 carbon atoms, particularly preferably from 6 to 12 carbon atoms and being exemplified by phenyl, p-methylphenyl, naphthyl, and anthranyl), an amino group (containing preferably from 0 to 30 carbon atoms, more preferably from 0 to 20 carbon atoms, particularly preferably from 0 to 10 carbon atoms and being exemplified by amino, methylamino, dimethylamino, diethylamino, dibenzylamino, diphenylamino, and ditolylamino), an alkoxy group (containing preferably from 1 to 30 carbon atoms, more preferably from 1 to 20 carbon atoms, particularly preferably from 1 to 10 carbon atoms and being exemplified by methoxy, ethoxy, butoxy, and 2-ethylhexyloxy), an aryloxy group (containing preferably from 6 to 30 carbon atoms, more preferably from 6 to 20 carbon atoms, particularly preferably from 6 to 12 carbon atoms and being exemplified by phenyloxy, 1-naphthyloxy, and 2-naphthyloxy), a hetero ring oxy group (containing preferably from 1 to 30 carbon atoms, more preferably from 1 to 20 carbon atoms, particularly preferably from 1 to 12 carbon atoms and being exemplified by pyridyloxy, pyrazyloxy, pyrimidyloxy, and quinolyloxy), an acyl group (containing preferably from 1 to 30 carbon atoms, more preferably from 1 to 20 carbon atoms, particularly preferably from 1 to 12 carbon atoms and being exemplified by acetyl, benzoyl, formyl, and pivaloyl), an alkoxycarbonyl group (containing preferably from 2 to 30 carbon atoms, more preferably from 2 to 20 carbon atoms, particularly preferably from 2 to 12 carbon atoms and being exemplified by methoxycarbonyl and ethoxycarbonyl), an aryloxycarbonyl group (containing preferably from 7 to 30 carbon atoms, more preferably from 7 to 20 carbon atoms, particularly preferably from 7 to 12 carbon atoms and being exemplified by phenyloxycarbonyl), an acyloxy group (containing preferably from 2 to 30 carbon atoms, more preferably from 2 to 20 carbon atoms, particularly preferably from 2 to 10 carbon atoms and being exemplified by acetoxy and benzoyloxy), an acylamino group (containing preferably from 2 to 30 carbon atoms, more preferably from 2 to 20 carbon atoms, particularly preferably from 2 to 10 carbon atoms and being exemplified by acetylamino and benzoylamino), an alkoxycarbonylamino group (containing preferably from 2 to 30 carbon atoms, more preferably from 2 to 20 carbon atoms, particularly preferably from 2 to 12 carbon atoms and being exemplified by methoxycarbonylamino), an aryloxycarbonylamino group (containing preferably from 7 to 30 carbon atoms, more preferably from 7 to 20 carbon atoms, particularly preferably from 7 to 12 carbon atoms and being exemplified by phenyloxycarbonylamino), a sulfonylamino group (containing preferably from 1 to 30 carbon atoms, more preferably from 1 to 20 carbon atoms, particularly preferably from 1 to 12 carbon atoms and being exemplified by methanesulfonylamino and benzenesulfonylamino), a sulfamoyl group (containing preferably from 0 to 30 carbon atoms, more preferably from 0 to 20 carbon atoms, particularly preferably from 0 to 12 carbon atoms and being exemplified by sulfamoyl, methylsulfamoyl, dimethylsulfamoyl, and phenylsulfamoyl), a carbamoyl group (containing preferably from 1 to 30 carbon atoms, more preferably from 1 to 20 carbon atoms, particularly preferably from 1 to 12 carbon atoms and being exemplified by carbamoyl, methylcarbamoyl, diethylcarbamoyl, and phenylcarbamoyl), an alkylthio group (containing preferably from 1 to 30 carbon atoms, more preferably from 1 to 20 carbon atoms, particularly preferably from 1 to 12 carbon atoms and being exemplified by methylthio and ethylthio), an arylthio group (containing preferably from 6 to 30 carbon atoms, more preferably from 6 to 20 carbon atoms, particularly preferably from 6 to 12 carbon atoms and being exemplified by phenylthio), a hetero ring thio group (containing preferably from 1 to 30 carbon atoms, more preferably from 1 to 20 carbon atoms, particularly preferably from 1 to 12 carbon atoms and being exemplified by pyridylthio, 2-benzimidazolylthio, 2-benzoxazolylthio, and 2-benzothiazolylthio), a sulfonyl group (containing preferably from 1 to 30 carbon atoms, more preferably from 1 to 20 carbon atoms, particularly preferably from 1 to 12 carbon atoms and being exemplified by mesyl and tosyl), a sulfinyl group (containing preferably from 1 to 30 carbon atoms, more preferably from 1 to 20 carbon atoms, particularly preferably from 1 to 12 carbon atoms and being exemplified by methanesulfinyl and benzenesulfinyl), a ureido group (containing preferably from 1 to 30 carbon atoms, more preferably from 1 to 20 carbon atoms, particularly preferably from 1 to 12 carbon atoms and being exemplified by ureido, methylureido, and phenylureido), a phosphoric acid amido group (containing preferably from 1 to 30 carbon atoms, more preferably from 1 to 20 carbon atoms, particularly preferably from 1 to 12 carbon atoms and being exemplified by diethylphosphoric acid amido and phenylphosphoric acid amido), a hydroxyl group, a mercapto group, a halogen atom (e.g., a fluorine atom, a chlorine atom, a bromine atom, or an iodine atom), a cyano group, a sulfo group, a carboxyl group, a nitro group, a hydroxamic acid group, a sulfino group, a hydrazino group, an imino group, a hetero ring group (containing preferably from 1 to 30 carbon atoms, more preferably from 1 to 12 carbon atoms; examples of the hetero atom being nitrogen atom, oxygen atom, and sulfur atom; specific examples thereof including imidazolyl, pyridyl, quinolyl, furyl, thienyl, piperidyl, morpholino, benzoxazolyl, benzimidazolyl, benzothiazolyl, carbazolyl, and azepinyl), a silyl group (containing preferably from 3 to 40 carbon atoms, more preferably from 3 to 30 carbon atoms, particularly preferably from 3 to 24 carbon atoms and being exemplified by trimethylsilyl and triphenylsilyl), and a silyloxy group (containing preferably from 3 to 40 carbon atoms, more preferably from 3 to 30 carbon atoms, particularly preferably from 3 to 24 carbon atoms and being exemplified by trimethylsilyloxy and triphenylsilyloxy). These substituents may further be substituted. As such substituents, an alkyl group, an aryl group, a hetero ring group, a halogen atom, and a silyl group are preferred, an alkyl group, an aryl group, a hetero ring group, and a halogen atom are more preferred, and an alkyl group, an aryl group, an aromatic hetero ring group, and a fluorine atom are still more preferred. Of the above-described ones, the following 2,4,6-triazinetriyl group is particularly preferred as $L^{41}$.

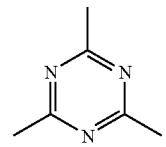

$Z^{41}$ in the formula (A-1) represents a group of atoms necessary for forming a nitrogen-containing hetero ring, and the nitrogen-containing hetero ring formed by containing $Z^{41}$ may be a monocyclic ring or a condensed ring wherein two or more rings are condensed. The nitrogen-containing hetero ring formed by containing $Z^{41}$ is preferably a 5- to 8-membered, nitrogen-containing hetero ring, more preferably a 5- to 7-membered, nitrogen-containing hetero ring, still more preferably a 5- or 6-membered, nitrogen-containing heteroaromatic ring, particularly preferably a 5-membered aromatic hetero ring. Plural, nitrogen-containing hetero rings each formed by containing $Z^{41}$ and connected to $L^{41}$ may be the same or different from each other.

Specific examples of the nitrogen-containing hetero ring formed by containing $Z^{41}$ include a pyrrole ring, an indole ring, an oxazole ring, an oxadiazole ring, a thiazole ring, a thiadiazole ring, an azaindole ring, a carbazole ring, a carbolin ring (norharman ring), an imidazole ring, a benzimidazole ring, an imidazopyridine ring, a purine ring, a pyrazole ring, an indazole ring, an azaindazole ring, a triazole ring, a tetrazole ring, an azepine ring, an iminostilbene ring (dibenzazepine ring), a tribenzazepine ring, a phenothiazine ring, and a phenoxazine ring. Preferred are an oxadiazole ring, a triazole ring, an imidazole ring, a benzimidazole ring, and an imidazopyridine ring, and more preferred are a benzimidazole ring and an imidazopyridine ring.

$Z^{41}$ may form, if possible, a further condensed ring with other ring, and may have a substituent. As a substituent which can be introduced into $Z^{41}$, there can be employed, for example, those which have been illustrated as substituents for $L^{41}$ in the formula (A-1), with preferred examples being also the same as described there.

$n^{41}$ represents an integer of 2 or more, preferably 2 to 8, more preferably 2 to 6.

As specific examples of the compound represented by the formula (A-1), there are illustrated, for example, the following compounds.

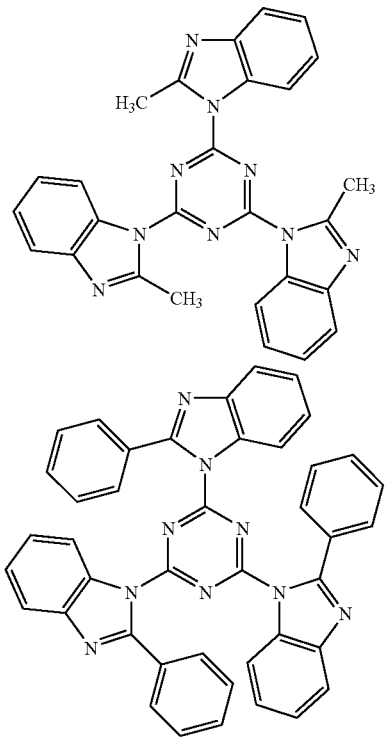

Next, compounds represented by the formula (B-1) will be described below.

$L^{B1}$ in the formula (B-1) represents a linking group. As the linking group represented by $L^{B1}$, there can be employed those which have been illustrated as specific examples of the linking group $L^{A1}$ in the formula (A-1). $L^{B1}$ is preferably a single bond, an aromatic hydrocarbon ring, an aromatic hetero ring having a valence of 2 or more, a carbon atom, a nitrogen atom, or a silicon atom, more preferably an aromatic hydrocarbon ring or an aromatic hetero ring having a valence of 2 or more, still more preferably a 1,3,5-benzenetriyl group, a 1,2,5,6-benzenetetrayl group, a 1,2,3,4,5,6-benzenehexayl group, a 2,2'-dimethyl-4,4'-biphenylene group, a 2,4,6-pyridinetriyl group, a 2,3,4,5,6-pyridinepentayl group, a 2,4,6-pyrimidinetriyl group, a 2,4,6-triazinetriyl group, a 2,3,4,5-thiophenetetrayl group, a carbon atom, a nitrogen atom, or a silicon atom.

$L^{B1}$ may further have a substituent. As a substituent which can be introduced, there can be employed, for example, those which have been illustrated as substituents for $L^{A1}$ in the formula (A-1), with preferred examples being also the same as described there.

As $L^{B1}$, of the above-described ones, a 1,3,5-benzenetriyl group is particularly preferred.

$Z^{B1}$ represents a group of atoms necessary for forming an aromatic hydrocarbon ring or an aromatic hetero ring, and the aromatic hydrocarbon ring or an aromatic hetero ring formed by containing $Z^{B1}$ may be a monocyclic ring or a condensed ring wherein two or more rings are condensed. Plural, aromatic hydrocarbon rings or aromatic hetero rings each formed by containing $Z^{B1}$ and connected to $L^{B1}$ may be the same or different from each other.

The aromatic hydrocarbon ring formed by containing $Z^{B1}$ is an aromatic hydrocarbon ring containing preferably from 6 to 30 carbon atoms, more preferably from 6 to 20 carbon atoms, particularly preferably from 6 to 12 carbon atoms, and is exemplified by a benzene ring, a naphthalene ring, an anthracene ring, a phenanthrene ring, a pyrene ring, and a triphenylene ring, with a benzene ring, a naphthalene ring, a phenanthrene ring, and a triphenylene ring being preferred.

The aromatic hetero ring formed by containing $Z^{B1}$ is a monocyclic ring or a condensed ring wherein two or more rings are condensed, and is an aromatic hetero ring containing preferably from 1 to 20 carbon atoms, more preferably from 2 to 12 carbon atoms, still more preferably from 2 to 10 carbon atoms. The hetero ring is preferably an aromatic hetero ring containing at least one of nitrogen atom, oxygen atom, and sulfur atom. Specific examples of the hetero ring formed by containing $Z^{B1}$ include a pyridine ring, a quinoline ring, an isoquinoline ring, an acridine ring, a phenanthridine ring, a pteridine ring, a pyrazine ring, a quinoxaline ring, a pyrimidine ring, a quinazoline ring, a pyridazine ring, a cinnoline ring, a phthalazine ring, a triazine ring, an oxazole ring, a benzoxazole ring, a thiazole ring, a benzothiazole ring, an imidazole ring, a benzimidazole ring, a pyrazole ring, an indazole ring, an isoxazole ring, a benzisoxazole ring, an isothiazole ring, a benzisothiazole ring, an oxadiazole ring, a thiadiazole ring, a triazole ring, a tetrazole ring, a furan ring, a benzofuran ring, a thiophene ring, a benzothiophene ring, a pyrrole ring, an indole ring, an imidazopyridine ring, a carbazole ring, and a phenanthroline ring. Of these, a pyridine ring, a quinoline ring, an isoquinoline ring, an acridine ring, a phenanthridine ring, a pyrazine ring, a quinoxaline ring, a pyrimidine ring, a quinazoline ring, a pyridazine ring, a phthalazine ring, a triazine ring, an imidazole ring, a benzimidazole ring, a pyrazole ring, an indazole ring, an oxadiazole ring, a triazole ring, an imidazopyridine ring, a carbazole ring, and a phenanthroline ring are preferred, a pyridine ring, a quinoline ring, an isoquinoline ring, a pyrazine ring, a quinoxaline ring, a pyrimidine ring, a quinazoline ring, a pyridazine ring, a phthalazine ring, a triazine ring, an imidazole ring, a benzimidazole ring, an oxadiazole ring, a triazole ring, an imidazopyridine ring, and a phenanthroline ring are more preferred, a benzimidazole ring, an oxadiazole ring, a triazole ring, an imidazopyridine ring, and a phenanthroline ring are still more preferred, and a benzimidazole ring and an imidazopyridine ring are particularly preferred.

The aromatic hydrocarbon ring or aromatic hetero ring formed by containing $Z^{B1}$ may form a further condensed ring with other ring, and may have a substituent. As a substituent which can be introduced into $Z^{B1}$, there can be employed, for example, those which have been illustrated as substituents for $L^{A1}$ in the formula (A-1), with preferred examples being also the same as described there.

$n^{B1}$ represents an integer of 2 or more, preferably 2 to 8, more preferably 2 to 6.

As specific examples of the compound represented by the formula (B-1), there are illustrated, for example, the following compounds.

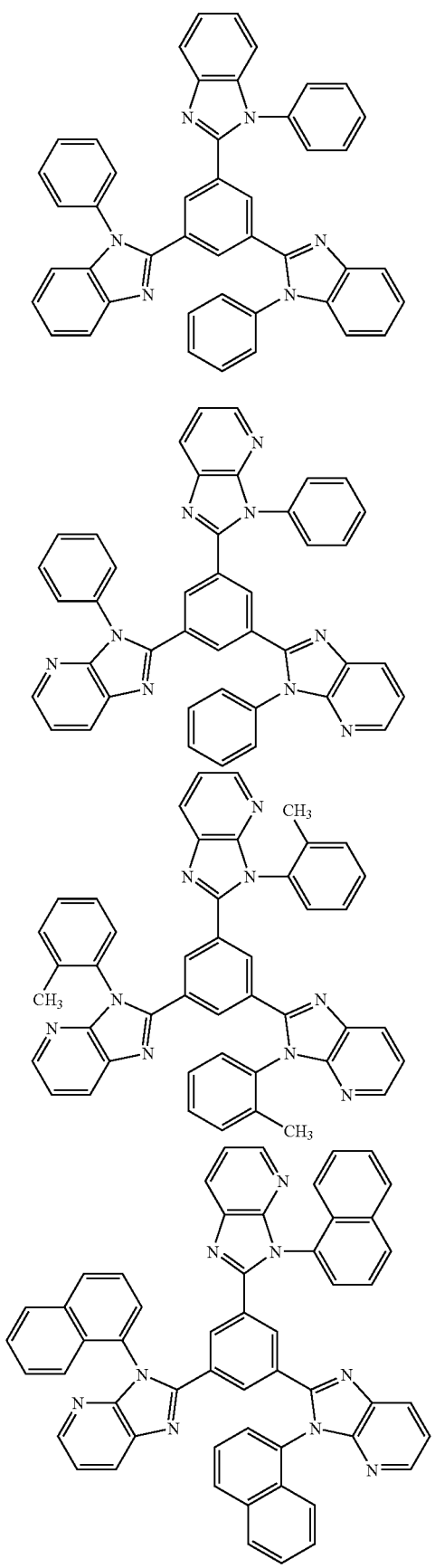

In addition to these compounds, there may be used, as an electron transporting material, oxadiazole derivatives such as 1,3-bis(4-tert-butylphenyl-1,3,4-oxadiazolyl)phenylene (OXD-7); anthraquinodimethane derivatives; diphenylquinone derivatives; bathocuproin, bathophenanthroline, and derivatives thereof; triazole compounds; tris(8-hydroxyquinolinato)aluminum complex and bis(4-methyl-8-quinolinato)aluminum complex; distyrylarylene derivatives; and silol compounds. Also, porphyrin series compounds, styryl series compounds such as DCM (4-dicyanomethylene-2-methyl-6-(4-dimethylaminostyryl)-4H-pyran), and 4H pyran series compounds may be used as well.

(Electron-Blocking Layer)

Also, the electrically conductive materials constituting the electron-blocking layer is preferably a hole transporting material such as pentacene or the derivative thereof.

The hole transporting material is a material which blocks electrons and passes holes, and is an organic compound having the tendency of easily donating electrons, such as pentacene or an amine compound. Specifically a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a condences aromatic hydrocarbon ring compound (a naphthalene derivative, an anthracene derivative, a phenanthrene derivative, a tetracene derivative, a pyrene derivative, a perylene derivative, or a fluoranthene derivative), and a metal complex having a nitrogen-containing hetero ring compound as a ligand can be used.

For example, as low-molecular materials, there may be used aromatic diamine compounds such as N,N'-bis(3-methylphenyl)-(1,1'-biphenyl)-4,4'-diamine (TPD) and 4,4'-bis[N-(naphthyl)-N-phenyl-amino]biphenyl (α-NPD); oxazole, oxadiazole, triazole, imidazole, and imidazolone; stilbene derivatives; pyrazoline derivatives; tetrahydroimidazole; polyarylalkane; butadiene; 4,4',4''-tris(N-(3-methylphenyl)-N-phenylamino)triphenylamine (m-MTDATA); porphyrine compounds such as porphine, copper tetraphenylporphine, phthalocianine, copper phthalocyanine, and titanium phthalocyanine oxide; triazole derivatives; oxadiazole derivatives; imidazole derivatives; polyarylalkane derivatives; pyrazoline derivatives; pyrazolone derivatives; phenylenediamine derivatives; anneal amine derivatives; amino-substituted chalcone derivatives; oxazole derivatives; styrylanthracene derivatives; fluorenone derivatives; hydrazone derivatives; and silazane derivatives. As high-molecular materials, there may be used polymers of phenylenevinylene, fluorine, carbazole, indole, pyrene, pyrrole, picoline, thiophene, acetylene, diacetylene, etc. and derivatives thereof. Among materials which are not electron-donating organic materials, those materials can be used which have sufficient hole-transporting properties.

The value obtained by dividing the voltage externally applied across the upper electrode 104 and the lower electrode 101 by the distance between the electrode 101 and the electrode 104 is preferably from $1.0 \times 10^5$ V/cm to $1.0 \times 10^7$ V/cm.

Regarding thickness of the charge-blocking layer, in case when this thickness is too small, there results insufficient blocking properties whereas, in case when too thick, there results reduced photoelectric conversion efficiency due to the small electric field applied to the photoelectric conversion layer, thus the thickness being preferably from 0.01 to 15 μm, more preferably from 0.03 to 1 μm, still more preferably from 0.05 to 0.2 μm. Also, regarding the content of the charge transporting material to be contained in the charge-blocking layer, in case when the content of the charge transporting material is too small, transportation of signal charge becomes difficult, leading to low photoelectric conversion efficiency. On the other hand, the content is too large, the polymer fails to sufficiently exhibit its properties as a binder, leading to deterioration of film stability and adhesion properties to the photoelectric conversion layer. Therefore, such contents are not preferred. Thus, the content of the charge transporting material is preferably 0.01 wt % or more, more preferably from 1 to 50 wt %, of the charge-blocking layer.

According to the photoelectric conversion element of such constitution, the element has a constitution wherein a charge-blocking layer 105 (or 103) is provided between one of the pair of electrodes 101 and 104 and the photoelectric conversion layer 102, with this charge-blocking layer containing both the insulating material and the electrically conductive material. When an incident light is introduced from one side of the pair of electrodes 101 and 104, a signal charge is generated in the photoelectric conversion portion and, upon transferring the signal charge from the photoelectric conversion portion 102 to other electrode, the signal charge can be transported by the electrically conductive material contained in the charge-blocking layer. Such constitution serves to suppress generation of dark current by suppressing migration of the signal charge with the insulating material and, at the same time, improve photoelectric conversion efficiency by transporting the signal charge with the electrically conductive material.

In the following second to fifth exemplary embodiments, structural examples of a sensor wherein the photoelectric conversion element as described above is stacked on or above a semiconductor substrate are described. Additionally, in the embodiments to be described hereinafter, descriptions on members having the same structure and the same function as those of the members having been already described are simplified or omitted by applying the same reference numerals and signs or corresponding reference numerals and signs to them in the drawings.

(Second Embodiment)

Figure 2:
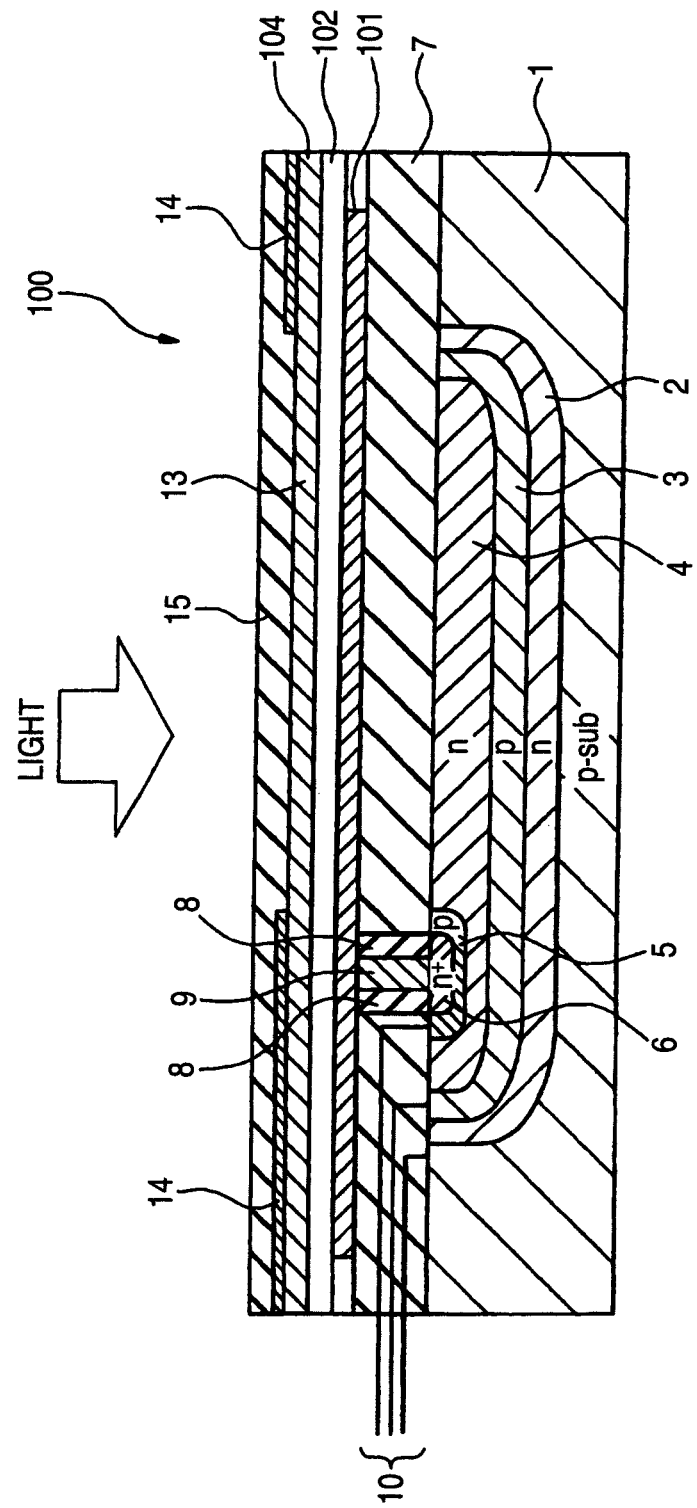
FIG. 2 is a cross-sectional view showing a second exemplary embodiment of the photoelectric conversion element.

FIG. 2 is a cross-sectional schematic view showing one pixel of a solid-state imaging device for illustrating a second exemplary embodiment of the invention. In FIG. 2, the same reference numerals and signs are applied to the same structural members as those in FIG. 1.

In a solid-state imaging device 100, a number of pixels shown in FIG. 2 are arranged on the same plane in an array pattern, and data on one pixel of an image data can be generated by a signal obtained from the one pixel.

One pixel of the solid-state imaging device shown in FIG. 2 includes a p-type silicon substrate 1, a transparent insulating film 7 formed on the p-type silicon substrate 1, and a photoelectric conversion element of the structure described in the first embodiment comprising a lower electrode 101 formed on the insulating film 7, a photoelectric conversion layer 102 formed on the lower electrode 101, an electron-blocking layer 103 (not shown) formed on the photoelectric conversion layer 102, a hole-blocking layer 105 (not shown) formed under the photoelectric conversion layer 102, and an upper electrode 104 formed on the electron-blocking layer 103 and, on the photoelectric conversion element, a light shielding layer 14 having an opening is formed. A transparent insulating film 15 is formed on the upper electrode 104.

Within the p-type silicon substrate 1, an n-type impurity region (hereinafter abbreviated as "n region") 4, a p-type impurity region (hereinafter abbreviated as "p region") 3, and an n region 2 are formed in this order from the shallow side of the substrate 1. In the surface portion of the n region 4 light-shielded by the light-shielding film 14, a highly concentrated n region (referred to as n+ region) 6 is formed, and is surrounded by a p-region 5.

The depth from the surface of the p-type silicon substrate 1 to the pn junction surface between the n region 4 and the p region 3 is adjusted to be a depth of absorbing blue light (about 0.2 μm). Thus, the n region 4 and the p region 3 form a photodiode (B photodiode) which absorbs blue light and accumulate charge in an amount in proportion to the absorbed light. In this embodiment, the B photodiode is formed within the semiconductor substrate, and functions as a charge-accumulating portion for accumulating the charge having been generated in the photoelectric conversion layer of the photoelectric conversion portion 102. Electrons generated in the B photodiode are accumulated in the n region 4.

The depth from the surface of the p-type silicon substrate 1 to the pn junction surface between the n region 2 and the p-type silicon substrate 1 is adjusted to be a depth of absorbing red light (about 2 μm). Thus, the n region 2 and the p-type silicon substrate 1 form a photodiode (R photodiode) which absorbs red light and accumulate charge generated in an amount in proportion to the absorbed light. The R photodiode is formed within the semiconductor substrate, and functions as a charge-accumulating portion for accumulating the charge having been generated in the photoelectric conversion layer of the photoelectric conversion portion 102. Electrons generated in the R photodiode are accumulated in the n region 2.

The n+ region 6 is electrically connected to the lower electrode 101 via a connecting portion 9 formed in the opening formed in the insulating film 7. Holes collected by the lower electrode 101 recombine with electrons in the n+ region 6, and hence electrons accumulated upon resetting in the n+ region 6 are to be reduced corresponding to the number of collected holes. The connecting portion 9 is electrically insulated by the insulating film 8 except for the lower electrode 101 and the n+ region 6.

Electrons accumulated in the n region 2 are converted to a signal corresponding to the charge amount by a MOS circuit (not shown) comprising an n-channel MOS transistor formed within the p-type silicon substrate 1, electrons accumulated in the n region 4 are converted to a signal corresponding to the charge amount by a MOS circuit (not shown) comprising an n-channel MOS transistor formed within the p region 3, and electrons accumulated in the n+ region 6 are converted to a signal corresponding to the charge amount by a MOS circuit (not shown) comprising an n-channel MOS transistor formed within the p region 5, and then outputted to the outside of the solid-state imaging device 100. Each MOS circuit is connected to a signal read-out pad not shown by a wiring 10. Additionally, when the n region 2 and the n region 4 are provided with extraction electrodes and a predetermined reset voltage is applied thereto, each region is depleted, and the capacity of each pn junction portion becomes extremely small. Thus, the capacity to be generated at the junction surface can be made extremely small.

By the above-described structure, G light (light of a green wavelength region) can be photoelectrically converted in the photoelectric conversion layer 102, and B light (light of a blue wavelength region) and R light (light of a red wavelength region) can be photoelectrically converted by the B photodiode and the R photodiode within the p-type silicon substrate 1, respectively. Also, since G light is first absorbed by the upper portion, color separation between B and G and between G and R is excellent. This is the greatly excellent point in comparison with a solid-state imaging device of the type wherein three PDs are stacked within the silicon substrate and all of B, G, and R lights are separated from each other within the substrate.

In the solid-state imaging device 100 of this embodiment, a constitution is employed wherein either the electron-blocking layer or the hole-blocking layer is of the type which blocks migration of injected charge and carries charge reverse to the injected charge. Such constitution serves to suppress generation of dark current by suppressing migration of the injected charge with the insulating material contained in the charge-blocking layer and, at the same time, improve photoelectric conversion efficiency by transporting the signal charge with the electrically conductive material.

(Third Embodiment)

In this embodiment, two photodiodes are not stacked within the silicon substrate 1 shown in FIG. 2, but are arranged in the vertical direction to the entering direction of the incident light to detect two color lights within the p-type silicon substrate.

Figure 3:
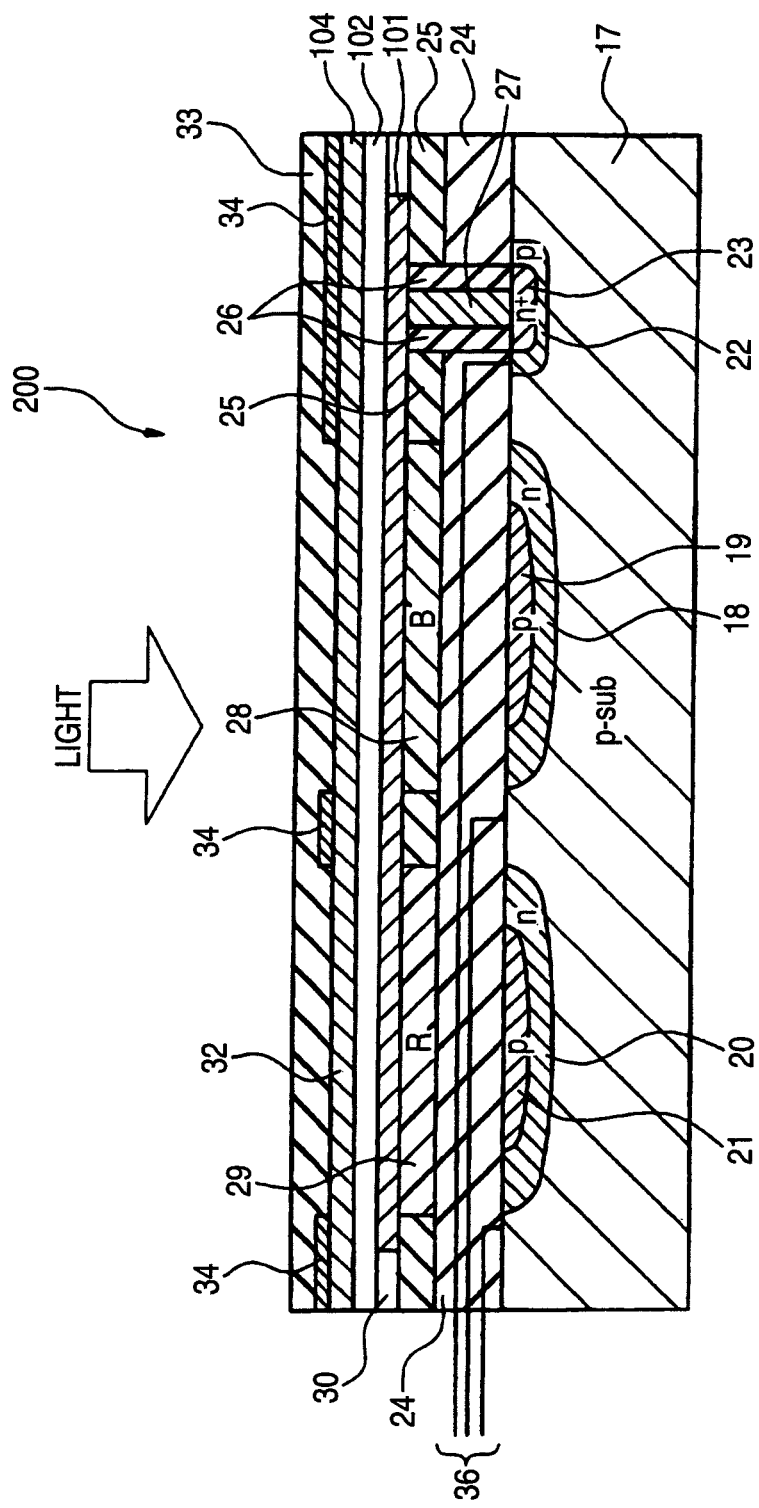
FIG. 3 is a cross-sectional view showing a third exemplary embodiment of the photoelectric conversion element.

FIG. 3 is a cross-sectional schematic view showing one pixel of a solid-state imaging device for illustrating a third exemplary embodiment of the invention. In FIG. 3, the same reference numerals and signs are applied to the same structural members as those in FIG. 1.

One pixel of the solid-state imaging device 200 shown in FIG. 3 includes a p-type silicon substrate 17, and a photoelectric conversion element of the structure described in the first embodiment comprising a lower electrode 101 formed above the p-type silicon substrate 17, a photoelectric conversion layer 102 formed on the lower electrode 101, an electron-blocking layer 103 (not shown) formed on the photoelectric conversion layer 102, a hole-blocking layer 105 (not shown) formed under the photoelectric conversion layer 102, and an upper electrode 104 formed on the electron-blocking layer 103 and, on the photoelectric conversion element, a light shielding layer 34 having an opening is formed. Also, a transparent film 33 is formed on the upper electrode 104.

In the surface portion of the p-type silicon substrate 17 located under the opening of the light-shielding film 34, a photodiode comprising a p region 19 and an n region 18 and a photodiode comprising a p region 21 and an n region 20 are formed side by side. Any plane direction on the surface of the p-type silicon substrate 17 is vertical to the incident direction of an entering light.

A color filter 28 capable of transmitting B light via a transparent insulating film 24 is formed above the photodiode comprising the p region 19 and the n region 18, and a color filter 29 capable of transmitting R light via a transparent insulating film 24 is formed above the photodiode comprising the p region 21 and the n region 20, with the lower electrode 101 being formed on them. The color filters 28 and 29 are surrounded by a transparent insulating film 25.

The photodiode comprising the p region 19 and the n region 18 functions as an intra-substrate photoelectric conversion portion which absorbs B light transmitted through the color filter 28, generates electrons in proportion to the absorbed light, and accumulates generated electrons in the n region 18. The photodiode comprising the p region 21 and the n region 20 functions as an intra-substrate photoelectric conversion portion which absorbs R light transmitted through the color filter 29, generates electrons in proportion to the absorbed light, and accumulates generated electrons in the n region 20.

An n+ region 23 is formed in the surface portion of the n-type silicon substrate 17 shielded by the light-shielding film 34, and is surrounded by the p region 22.

The n+ region 23 is electrically connected to the lower electrode 101 via a connecting portion 27 formed in the opening formed in the insulating films 24 and 25. Holes collected by the lower electrode 101 recombine with electrons in the n+ region 23, and hence electrons accumulated upon resetting in the n+ region 23 are to be reduced correspondingly to the number of collected holes. The connecting portion 27 is electrically insulated by the insulating film 26 except for the lower electrode 101 and the n+ region 23.

Electrons accumulated in the n region 18 are converted to a signal corresponding to the charge amount by a MOS circuit (not shown) comprising an n-channel MOS transistor formed within the p-type silicon substrate 17, electrons accumulated in the n region 20 are converted to a signal corresponding to the charge amount by a MOS circuit (not shown) comprising an n-channel MOS transistor formed within the p-type silicon substrate 17, and electrons accumulated in the n+ region 23 are converted to a signal corresponding to the charge amount by a MOS circuit (not shown) comprising an n-channel MOS transistor formed within the p region 22, and then outputted to the outside of the solid-state imaging device 200. Each MOS circuit is connected to a signal read-out pad not shown through a wiring 36.

Additionally, the signal read-out portion may be constituted not by the MOS circuit but by CCD and an amplifier. That is, the signal read-out portion may be a signal read-out portion wherein electrons accumulated in the n region 18, the n region 20, and the n+ region 23 are read out by CCD formed within the p-type silicon substrate 17, and the read-out signal is transferred to an amplifier by CCD which, in turn, outputs a signal corresponding to the amount of the electrons.

As is described above, the signal read-out portion is illustrated by CCD and CMOS structure but, in view of electric power consumption, high speed read-out performance, pixel addition performance, partial read-out performance, etc., CMOS is preferred.

In FIG. 3, color separation of the R light and the B light from each other is performed by means of the color filters 28 and 29. However, it is also possible to adjust the depth of the pn junction surface between the n region 20 and the p region 21 and the depth of the pn junction surface between the n region 18 and the p region 19 to thereby absorb the R light and the B light by the respective photodiodes, without providing the color filters 28 and 29. In this case, it is also possible to form, between the p-type silicon substrate 17 and the lower electrode 101 (for example, between the insulating film 24 and the p-type silicon substrate 17), an inorganic photoelectric conversion portion which comprises an inorganic material and can absorb light having transmitted through the photoelectric conversion layer 102, generate charges in proportion to the absorbed light amount, and accumulate them. In this case, it suffices to provide, within the p-type silicon substrate 17, a MOS circuit for reading out a signal corresponding to the amount of charges accumulated in the charge-accumulating region of the inorganic photoelectric conversion portion, with the MOS circuit being connected to the wire 36.

Also, a structure may be employed wherein one photodiode is provided within the p-type silicon substrate 17, and plural photoelectric conversion portions are stacked above the p-type silicon substrate 17. Further, a structure may be employed wherein plural photodiodes are provided within the p-type silicon substrate 17, and plural photoelectric conversion portions are stacked above the p-type silicon substrate 17. In addition, in the case where it is not necessary to form a color image, a structure may be employed wherein one photodiode is provided within the p-type silicon substrate 17, and only one photoelectric conversion portion is stacked.

In the solid-state imaging device 200 of this embodiment, a constitution is employed wherein either the electron-blocking layer or the hole-blocking layer is of the type which blocks migration of injected charge and carries charge reverse to the injected charge. Such constitution serves to suppress generation of dark current by suppressing migration of the injected charge with the insulating material contained in the charge-blocking layer and, at the same time, improve photoelectric conversion efficiency by transporting the signal charge with the electrically conductive material.

(Fourth Embodiment)

The solid-state imaging device of this embodiment has a structure wherein no photodiodes are provided within the silicon substrate shown in FIG. 1 but plural (three in this embodiment) photoelectric conversion elements are stacked above a silicon substrate.

Figure 4:
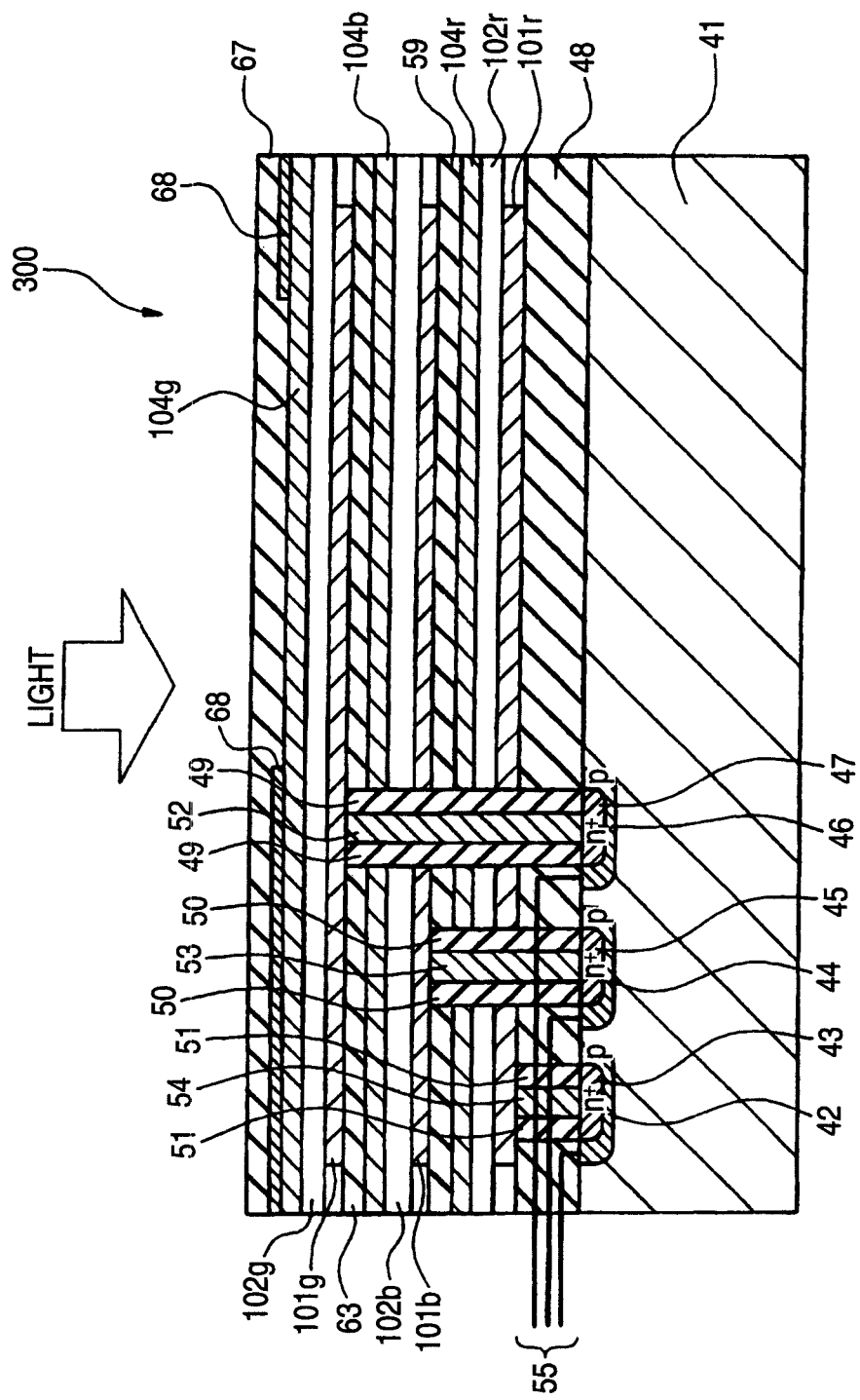
FIG. 4 is a cross-sectional view showing a fourth exemplary embodiment of the photoelectric conversion element.

FIG. 4 is a cross-sectional schematic view showing one pixel of a solid-state imaging device for illustrating a fourth exemplary embodiment of the invention.

A solid-state imaging device 300 shown in FIG. 4 has a structure wherein an R light photoelectric conversion element including a lower electrode 101r, a photoelectric conversion layer 102r stacked on the lower electrode 101r, a hole-blocking layer (not shown) formed on the photoelectric conversion layer 102r, an electron-blocking layer (not shown) formed under the photoelectric conversion layer 102r, and an upper electrode 104r stacked on the hole-blocking layer; a B light photoelectric conversion element including a lower electrode 101b, a photoelectric conversion layer 102b stacked on the lower electrode 101b, a hole-blocking layer (not shown) formed on the photoelectric conversion layer 102b, an electron-blocking layer (not shown) formed under the photoelectric conversion layer 102b, and an upper electrode 104b stacked on the hole-blocking layer; and a G light photoelectric conversion element including a lower electrode 101g, a photoelectric conversion layer 102g stacked on the lower electrode 101g, a hole-blocking layer (not shown) formed on the photoelectric conversion layer 102g, an electron-blocking layer (not shown) formed under the photoelectric conversion layer 102g, and an upper electrode 104g stacked on the hole-blocking layer; in this order above the silicon substrate 41 with each of the lower electrodes contained in each element facing the silicon substrate 41 side.

A transparent insulating film 48 is formed on the silicon substrate 41, the R light photoelectric conversion element is formed thereon, an insulating film 59 is formed thereon, the B light photoelectric conversion element is formed thereon, an insulating film 63 is formed thereon, the G light photoelectric conversion element is formed thereon, a light-shielding film 68 having an opening is formed thereon, and a transparent insulating film 67 is formed thereon.

The lower electrode 101g contained in the G light photoelectric conversion element, the photoelectric conversion layer 102g, the hole-blocking layer, the electron-blocking layer, and the upper electrode 104g respectively have the same structures as the lower electrode 101, the photoelectric conversion layer 102, the electron-blocking layer 103, the hole-blocking layer 105, and the upper electrode 104 shown in FIG. 1, provided that the photoelectric conversion layer 102g contains an organic material capable of absorbing a green light and generating electrons and holes in proportion to the amount of the absorbed light.

The lower electrode 101b contained in the B light photoelectric conversion element, the photoelectric conversion layer 102b, the hole-blocking layer, the electron-blocking layer, and the upper electrode 104b respectively have the same structures as the lower electrode 101, the photoelectric conversion layer 102, the electron-blocking layer 103, the hole-blocking layer 105, and the upper electrode 104 shown in FIG. 1, provided that the photoelectric conversion layer 102b contains an organic material capable of absorbing a blue light and generating electrons and holes in proportion to the amount of the absorbed light.

The lower electrode 101r contained in the R light photoelectric conversion element, the photoelectric conversion layer 102r, the hole-blocking layer, the electron-blocking layer, and the upper electrode 104r respectively have the same structures as the lower electrode 101, the photoelectric conversion layer 102, the electron-blocking layer 103, the hole-blocking layer 105, and the upper electrode 104 shown in FIG. 1, provided that the photoelectric conversion layer 102r contains an organic material capable of absorbing a red light and generating electrons and holes in proportion to the amount of the absorbed light.

In the surface portions of the silicon substrate 41 shielded by the light-shielding film 68, n+ regions 43, 45, and 47 are formed, with each of them being surrounded by p regions 42, 44, and 46, respectively.

The n+ region 43 is electrically connected to the lower electrode 101r via the connecting portion 54 formed in the opening formed in the insulating film 48. Holes collected by the lower electrode 101r recombine with electrons in the n+ region 43, and hence electrons accumulated upon resetting in the n+ region 43 are to be reduced corresponding to the number of collected holes. The connecting portion 54 is electrically insulated by the insulating film 51 except for the lower electrode 101r and the n+ region 43.

The n+ region 45 is electrically connected to the lower electrode 101b via the connecting portion 53 formed in the opening formed in the insulating film 48, in the R light photoelectric conversion element and in the insulating film 59. Holes collected by the lower electrode 101b recombine with electrons in the n+ region 45, and hence electrons accumulated upon resetting in the n+ region 45 are to be reduced corresponding to the number of collected holes. The connecting portion 53 is electrically insulated by the insulating film 50 except for the lower electrode 101b and the n+ region 45.

The n+ region 47 is electrically connected to the lower electrode 101g via the connecting portion 52 formed in the opening formed in the insulating layer 48, the R light photoelectric conversion element, the insulating film 59, the B light photoelectric conversion element, and in the insulating film 63. Holes collected by the lower electrode 101g recombine with electrons in the n+ region 47, and hence electrons accumulated upon resetting in the n+ region 47 are to be reduced corresponding to the number of collected holes. The connecting portion 52 is electrically insulated by the insulating film 49 except for the lower electrode 101g and the n+ region 47.

Electrons accumulated in the n+ region 43 are converted to a signal corresponding to the charge amount by a MOS circuit (not shown) comprising an n-channel MOS transistor formed within the p region 42, electrons accumulated in the n+ region 45 are converted to a signal corresponding to the charge amount by a MOS circuit (not shown) comprising an n-channel MOS transistor formed within the p region 44, and electrons accumulated in the n+ region 47 are converted to a signal corresponding to the charge amount by a MOS circuit (not shown) comprising an n-channel MOS transistor formed within the p region 46, and then outputted to the outside of the solid-state imaging device 300. Each MOS circuit is connected to a signal read-out pad not shown through a wiring 55. Additionally, the signal read-out portion may be constituted not by the MOS circuit but by CCD and an amplifier. That is, the signal read-out portion may be a signal read-out portion wherein electrons accumulated in the n+ regions 43, 45, and 47 are read out by CCD formed within the silicon substrate 41, and the read-out signal is transferred to an amplifier by CCD which, in turn, outputs a signal corresponding to the amount of the holes.

In the above descriptions, the photoelectric conversion layer capable of absorbing the B light means a layer which can absorb light of at least 400 to 500 nm in wavelength, with the absorbance at the peak wavelength in the wavelength region being preferably 50% or more. The photoelectric conversion layer capable of absorbing the G light means a layer which can absorb light of at least 500 to 600 nm in wavelength, with the absorbance at the peak wavelength in the wavelength region being preferably 50% or more. The photoelectric conversion layer capable of absorbing the R light means a layer which can absorb light of at least 600 to 700 nm in wavelength, with the absorbance at the peak wavelength in the wavelength region being preferably 50% or more.

In the solid-state imaging device 300 of this embodiment, a constitution is employed wherein either the electron-blocking layer or the hole-blocking layer is of the type which blocks migration of injected charge and carries charge reverse to the injected charge. Such constitution serves to suppress generation of dark current by suppressing migration of the injected charge with the insulating material contained in the charge-blocking layer and, at the same time, improve photoelectric conversion efficiency by transporting the signal charge with the electrically conductive material.

(Fifth Embodiment)

Figure 5:
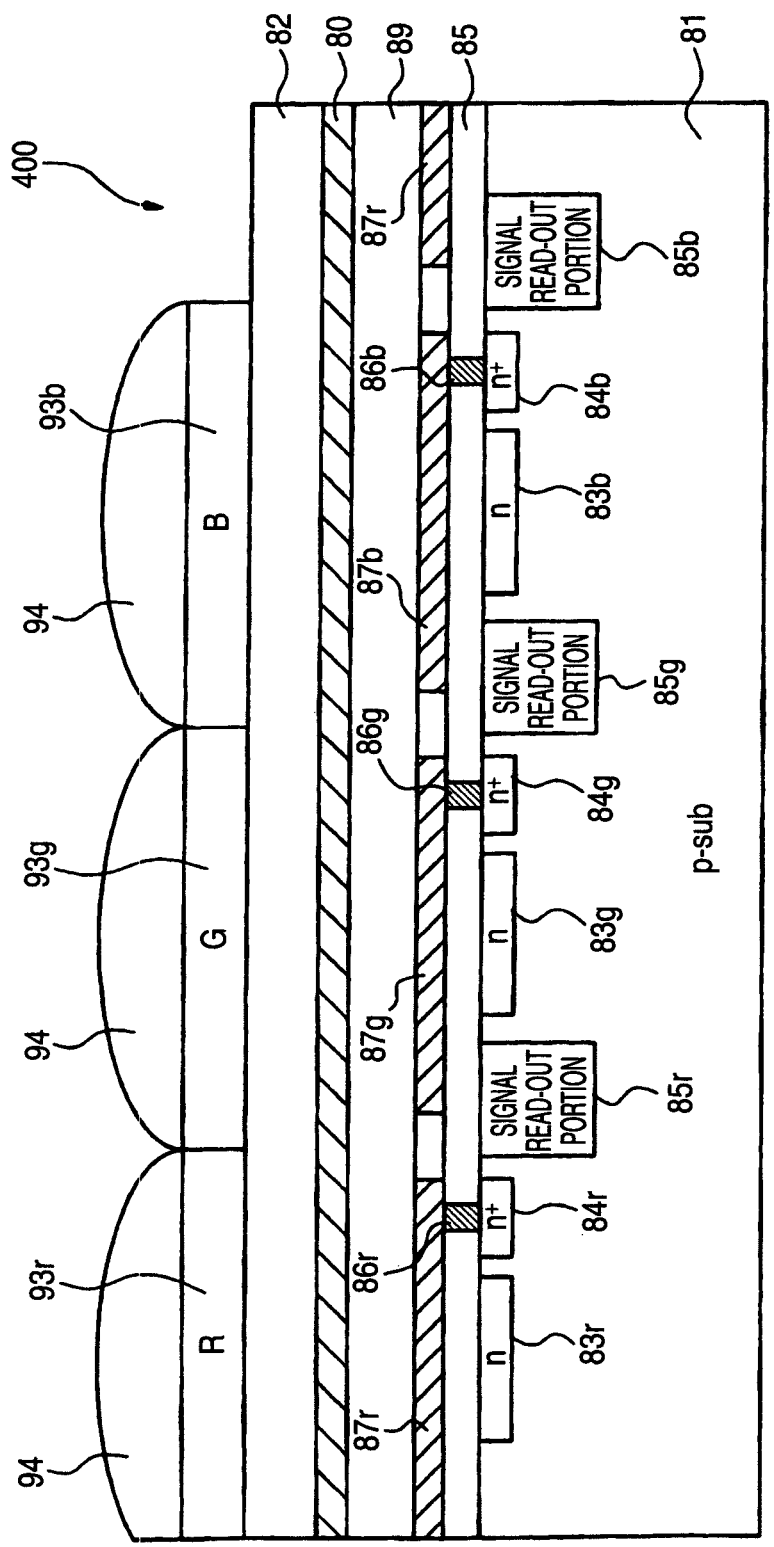
FIG. 5 is a cross-sectional view showing a fifth exemplary embodiment of the photoelectric conversion element.

FIG. 5 is a cross-sectional schematic view showing a solid-state imaging device for illustrating a fifth exemplary embodiment of the invention.

Three kinds of numerous color filters, i.e., color filters 93*r* transmitting light of mainly the wavelength region of R, color filters 93*g* transmitting light of mainly the wavelength region of G, and color filters 93*b* transmitting light of mainly the wavelength region of B are arranged on the same plane above the p-type silicon substrate 81 in the line direction and the row direction making the right angle with the line direction.

As materials for the color filter 93*r*, known materials may be used, though such materials transmit part of light in the infrared region as well as the light in the wavelength of R. As materials for the color filter 93*g*, known materials may be used, though such materials transmit part of light in the infrared region as well as the light in the wavelength of G. As materials for the color filter 93*b*, known materials may be used, though such materials transmit part of light in the infrared region as well as the light in the wavelength of B.

As the arrangement of the color filters 93*r*, 93*g* and 93*b*, color filter arrangements employed for known single-plate solid-state imaging devices (e.g., Bayer arrangement, longitudinal stripe arrangement, and transverse stripe arrangement) may be employed.

An n-type impurity region (hereinafter referred to as "n region") 83*r* is formed under the color filter 93*r* corresponding to the color filter 93*r*, and an R light photoelectric conversion element is constituted corresponding to the color filter 93*r* by pn junction of the n region 83*r* and the p-type silicon substrate 81.

An n region 83*g* is formed under the color filter 93*g* corresponding to the color filter 93*g*, and a G light photoelectric conversion element is constituted corresponding to the color filter 93*g* by pn junction of the n region 83*g* and the p-type silicon substrate 81.

An n region 83*b* is formed under the color filter 93*b* corresponding to the color filter 93*b*, and a B light photoelectric conversion element is constituted corresponding to the color filter 93*b* by pn junction of the n region 83*b* and the p-type silicon substrate 81.

A lower electrode 87*r* (having the same function as that of the lower electrode 101 in FIG. 1) is formed above the n region 83*r*, a lower electrode 87*g* (having the same function as that of the lower electrode 101 in FIG. 1) is formed above the n region 83*g*, and a lower electrode 87*b* (having the same function as that of the lower electrode 101 in FIG. 1) is formed above the n region 83*b*. The lower electrodes 87*r*, 87*g*, and 87*b* are divided so as to correspond to the color filters 93*r*, 93*g*, and 93*b*, respectively. Each of the lower electrodes 87*r*, 87*g*, and 87*b* is constituted by a material transmitting visible light and infrared light and, as such materials, there may be used, for example, ITO (Indium Tin Oxide) and IZO (Indium Zinc Oxide). Each of the transparent electrodes 87*r*, 87*g*, and 87*b* is buried in the insulating layer.

On each of the lower electrodes 87*r*, 87*g*, and 87*b*, there is formed a photoelectric conversion layer 89 (having the same function as that of the photoelectric conversion layer 102 in FIG. 1) of a one-sheet structure in common to the color filters 93*r*, 93*g*, and 93*b*, capable of absorbing mainly light in the infrared region (580 nm or more in wavelength) to generate charges in proportion to the absorbed light and transmitting light in the visible region (from about 380 nm to about 580 nm in wavelength) other than the light of infrared region. As materials for constituting the photoelectric conversion layer 89, phthalocyanine series organic materials and naphthalocyanine series organic materials are used.

On the photoelectric conversion layer 89, there is formed an upper electrode 80 (having the same function as that of the upper electrode 104 in FIG. 1) of a one-sheet structure in common to the color filters 93*r*, 93*g*, and 93*b*. The upper electrode 80 is constituted by a material transmitting visible light and infrared light and, for example, ITO or IZO may be used. Additionally, though not shown, an electron-blocking layer having the same function as that of the electron-blocking layer 103 shown in FIG. 1 is formed between the photoelectric conversion layer 89 and the upper electrode 80.

A photoelectric conversion element corresponding to the color filter 93*r* is formed by the lower electrode 87*r*, the upper electrode 80 opposing it, and part of the photoelectric conversion layer 89 sandwiched between them. Hereinafter, this photoelectric conversion element is referred to as "an R photoelectric conversion element formed on the substrate", because it is formed on the semiconductor substrate.

A photoelectric conversion element corresponding to the color filter 93*g* is formed by the lower electrode 87*g*, the upper electrode 80 opposing it, and part of the photoelectric conversion layer 89 sandwiched between them. Hereinafter, this photoelectric conversion element is referred to as "a G photoelectric conversion element formed on the substrate".

A photoelectric conversion element corresponding to the color filter 93*b* is formed by the lower electrode 87*b*, the upper electrode 80 opposing it, and part of the photoelectric conversion layer 89 sandwiched between them. Hereinafter, this photoelectric conversion element is referred to as "a B photoelectric conversion element formed on the substrate".

An n-type impurity region of high concentration (hereinafter referred to as "n+ region") 84*r* connected to the lower electrode 87*r* of the R photoelectric conversion element formed on the substrate is formed next to the n region 83*r*. Additionally, for preventing light from entering into the n+ region 84*r*, a light-shielding film is preferably provided on the n+ region 84*r*.

An n+ region 84g connected to the lower electrode 87g of the G photoelectric conversion element formed on the substrate is formed next to the n region 83g. Additionally, for preventing light from entering into the n+ region 84g, a light-shielding film is preferably provided on the n+ region 84g.

An n+ region 84b connected to the lower electrode 87b of the B photoelectric conversion element formed on the substrate is formed next to the n region 83b. Additionally, for preventing light from entering into the n+ region 84b, a light-shielding film is preferably provided on the n+ region 84b.

A contact portion 86r comprising a metal such as tungsten or aluminum is formed on the n+ region 84r, and the lower electrode 87r is formed on the contact portion 86r, thus the n+ region 84r being electrically connected to the lower electrode 87r via the contact portion 86r. The contact portion 86r is buried in the insulating layer 85 transmitting visible light and infrared light.

A contact portion 86g comprising a metal such as tungsten or aluminum is formed on the n+ region 84g, and the lower electrode 87g is formed on the contact portion 86g, thus the n+ region 84g being electrically connected to the lower electrode 87g via the contact portion 86g. The contact portion 86g is buried in the insulating layer 85.

A contact portion 86b comprising a metal such as tungsten or aluminum is formed on the n+ region 84b, and the lower electrode 87b is formed on the contact portion 86b, thus the n+ region 84b being electrically connected to the lower electrode 87b via the contact portion 86b. The contact portion 86b is buried in the insulating layer 85.

In regions other than the n regions 83r, 83g, and 83b, and n+ regions 84r, 84g, and 84b, there are formed a signal read-out portion 85r comprising an n-channel MOS transistor for reading out signals corresponding to the amounts of electrons accumulated in the n region 83r and n+ region 84r, respectively, a signal read-out portion 85g comprising an n-channel MOS transistor for reading out signals corresponding to the amounts of electrons accumulated in the n region 83g and n+ region 84g, respectively, and a signal read-out portion 85b comprising an n-channel MOS transistor for reading out signals corresponding to the amounts of electrons accumulated in the n region 83b and n+ region 84b, respectively. Each of the signal read-out portions 85r, 85g, and 85b may be constituted by CCD. Additionally, for preventing light from entering into the signal read-out portions 85r, 85g, and 85b, a light-shielding film is preferably provided on each of the signal read-out portions 85r, 85g, and 85b.

Such constitution enables one to obtain both an RGB color image and an infrared image at the same time with the same resolution. Therefore, this solid-state imaging device can be applied to, for example, a video scope.

In the solid-state imaging device 400 of this embodiment, a constitution is employed wherein either the electron-blocking layer or the hole-blocking layer is of the type which blocks migration of injected charge and carries charge reverse to the injected charge. Such constitution serves to suppress generation of dark current by suppressing migration of the injected charge with the insulating material contained in the charge-blocking layer and, at the same time, improve photoelectric conversion efficiency by transporting the signal charge with the electrically conductive material.

Of materials constituting the photoelectric conversion portions of the above-described embodiments, some of the photoelectric conversion materials may be organic semiconductors having a maximum peak of absorption spectrum in the near-infrared region. In such occasion, it is preferred for the photoelectric conversion material to be transparent to visible light. More preferably, the photoelectric conversion material is SnPc or a silicon naphthalocyanine.

Hereinafter, examples of the invention will be described. In the following examples, it is demonstrated that, in the photoelectric conversion element containing an insulating material and an electrically conductive material, dark current can be suppressed and, at the same time, improve the photoelectric conversion efficiency.

EXAMPLE 1

A 25-mm square glass substrate equipped with an ITO electrode is subjected to ultrasonic cleaning with successive, acetone, Semico Clean, and isopropyl alcohol (IPA), each for 15 minutes. After finally washing with boiling IPA, $UV/O_3$ washing is carried out.

Next, a hole-blocking layer containing fullerene is formed in a film form on this substrate. As fullerene 60, nanom purpule (C60) manufactured by Frontier Carbon Corporation is used. 2.5 wt % polycarbonate resin PCz (Yupiron PCZ-400; manufactured by Mitsubishi Gas Chemicals Company, Inc.) and 30 wt %, based on PCz, of fullerene $C_{60}$ are dissolved in o-dichlorobenzene to prepare a coating solution. This coating solution is spin-coated on the glass substrate to form a film, followed by evaporating the solvent in a vacuum drier to form a 1000-Å thick hole-blocking layer.

The substrate is then transferred into an organic vacuum deposition chamber and, while rotating the substrate holder, quinacridone (bought from Aldrich Japan K.K. and purified by sublimation) is vacuum deposited at a constant rate of 3.0 Å/sec on the hole blocking layer as a photoelectric conversion layer to form a 1000-Å thick photoelectric conversion layer.

Subsequently, this substrate is transferred to a metal vacuum deposition chamber while keeping in-vacuum. Aluminum is vacuum deposited on the hole-blocking layer as an opposing electrode to a thickness of 1000 Å. Also, the area of photoelectric conversion region formed by the lowermost ITO electrode and the aluminum opposing electrode is adjusted to 2 mm×2 mm. This substrate is transferred to a globe box wherein concentrations of moisture and oxygen are kept at 1 ppm or less, respectively, without exposing this substrate to the atmosphere, and its sealing with glass to which a moisture absorbent has been applied is carried out using a UV-curable resin.

A value of dark current flow at the time of no light irradiation and a value of a light current flowing at the time of light irradiation, when an external electric field of $1.0 \times 10^6$ V/cm$^2$ is applied to this element, are measured using an energy quantum efficiency measuring apparatus manufactured by Optel (Cathley 6430 being used as the source meter), and external quantum efficiency of the element is calculated from these values. Light irradiation is carried out to the area of 1.5 mmφ of the 2 mm×2 mm photoelectric conversion region. The amount of irradiated light is adjusted to 50 µW/cm$^2$. The wavelength employed for the measurement is 560 nm which is a maximum absorption wavelength of quinacridone forming the photoelectric conversion layer. Also, the value obtained by dividing the external quantum efficiency obtained at the time of light irradiation by the dark current density obtained at the time of no light irradiation is determined as S/N ratio.

EXAMPLE 2

An S/N ratio is calculated in the same manner as in Example 1 except for using fullerene C70 in place of fullerene C60.

EXAMPLE 3

An S/N ratio is calculated in the same manner as in Example 1 except for using fullerene oxide in place of fullerene C60.

EXAMPLE 4

An S/N ratio is calculated in the same manner as in Example 1 except for employing, as the hole-blocking layer, a mixture layer (7:3 by volume) formed by vacuum-depositing fullerene C60 according to the resistance heating method with simultaneously forming a film of $SiO_2$ according to the electron beam vacuum deposition method in place of the hole-blocking layer composed of PCz and fullerene C60.

EXAMPLE 5

An S/N ratio is calculated in the same manner as in Example 1 except for using ETM1 shown by the following formula in place of fullerene C60.

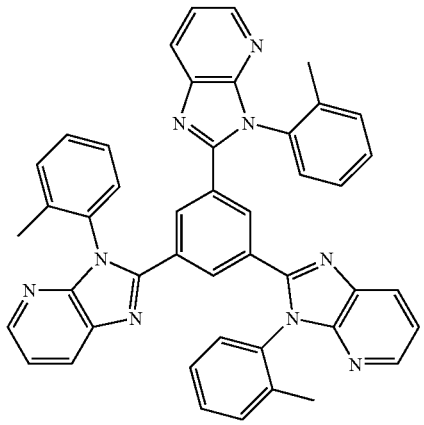 [SMILES: Cc1ccccc1-n1c(-c2cc(-c3nc4cccnc4n3-c3ccccc3C)cc(-c3nc4cccnc4n3-c3ccccc3C)c2)nc2cccnc21]

EXAMPLE 6

An S/N ratio is calculated in the same manner as in Example 1 except for using ETM2 shown by the following formula in place of fullerene C60.

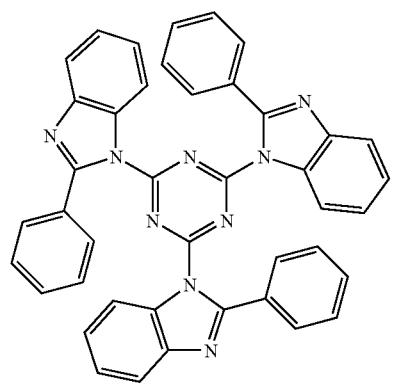 [SMILES: c1ccc(-c2nc3ccccc3n2-c2nc(-n3c(-c4ccccc4)nc4ccccc43)nc(-n3c(-c4ccccc4)nc4ccccc43)n2)cc1]

EXAMPLE 7

An S/N ratio is calculated in the same manner as in Example 1 except for using pentacene in place of fullerene C60, forming the electron-blocking layer and measuring in the opposite applied voltage direction.

COMPARATIVE EXAMPLE 1

An S/N ratio is calculated in the same manner as in Example 1 except for not using fullerene C60 but using only PCz to form the hole-blocking layer.

COMPARATIVE EXAMPLE 2

An S/N ratio is calculated in the same manner as in Example 1 except for forming a 100-nm thick $SiO_2$ layer as the hole-blocking layer by using a sputtering apparatus in place of the fullerene-mixed PCz.

COMPARATIVE EXAMPLE 3

An S/N ratio is calculated in the same manner as in Example 1 except for forming a 100-nm thick $SiO_2$ layer as the hole-blocking layer by the resistance heating vacuum deposition method with keeping a vacuum degree at about $5 \times 10^{-4}$ Pa in place of the fullerene-mixed PCz.

COMPARATIVE EXAMPLE 4

An S/N ratio is calculated in the same manner as in Example 5 except for not using pentacene but using only PCz to form the electron-blocking layer.

Results of the measurement in Examples and Comparative Examples are tabulated in the following table.

TABLE 1

| | Dark Current (A/cm²) | Photoelectric Conversion Efficiency (%) | S/N Ratio |
| --- | --- | --- | --- |
| Example 1 | 5.1E−07 | 35 | 6.9E+07 |
| Example 2 | 7.3E−07 | 32 | 4.4E+07 |
| Example 3 | 4.6E−07 | 31 | 6.7E+07 |
| Example 4 | 2.1E−07 | 15 | 7.1E+07 |
| Example 5 | 1.1E−07 | 19 | 1.7E+08 |
| Example 6 | 9.6E−08 | 12 | 1.3E+08 |
| Example 7 | 8.9E−07 | 22 | 2.5E+07 |
| Comparative Example 1 | 6.7E−08 | 0.5 | 7.5E+06 |
| Comparative Example 2 | 1.3E−09 | 0.02 | 1.5E+07 |
| Comparative Example 3 | 8.4E−07 | 12 | 1.4E+07 |
| Comparative Example 4 | 9.5E−08 | 0.2 | 2.1E+06 |

It can be seen from the above results that the photoelectric conversion elements of Examples 1 to 7 can suppress the dark current (A/cm²) value at a small level, can improve photoelectric conversion efficiency (%), and can provide a good S/N ratio.

On the other hand, the photoelectric conversion elements of Comparative Examples 1 to 4 fail to suppress dark current and improve photoelectric conversion efficiency at the same time, and each provides an S/N ratio lower than those of Examples 1 to 7.

What is claimed is:
1. A sensor comprising:
   a photoelectric conversion element comprising:
      a pair of electrodes;
      a photoelectric conversion layer between the pair of electrodes;
      a charge-blocking layer between one of the pair of the electrodes and the photoelectric conversion layer, wherein the charge-blocking layer is capable of suppressing injection of a charge from the one of the pair of electrodes into the photoelectric conversion layer upon application of a voltage across the pair of electrodes, and the charge-blocking layer contains in a single layer a mixture of an insulating material and an electrically conductive material;

a semiconductor substrate above which a photoelectric conversion portion including the pair of electrodes, the photoelectric conversion layer, and the charge-blocking layer is stacked;

a charge accumulating portion provided within the semiconductor substrate and accumulating a charge generated in the photoelectric conversion layer; and a connecting portion that electrically connects one of the pair of electrodes for collecting the charge to the charge accumulating portion, and a voltage applying part which applies a voltage of $1.0 \times 10^5$ V/cm to $1.0 \times 10^7$ V/cm to the photoelectric conversion layer upon irradiation of light, wherein the insulating material includes an organic high molecular polymer and the electrically conductive material includes an electron transporting material containing fullerene C60, fullerene C70 or fullerene oxide.

2. The sensor according to claim 1, wherein the charge-blocking layer has a thickness of 10 nm to 200 nm.

3. The sensor according to claim 1, further comprising an intra-substrate photoelectric conversion portion that is provided within the semiconductor substrate and that absorbs light transmitted through the photoelectric conversion layer and generates and accumulates a charge in proportion to an amount of the light.

4. The sensor according to claim 3, wherein the intra-substrate photoelectric conversion portion includes a plurality of photodiodes stacked within the semiconductor substrate and capable of absorbing light having different colors.

5. The sensor according to claim 4, wherein the number of the photoelectric conversion portion stacked above the semiconductor substrate is one, the plurality of the photodiodes includes a photodiode for blue light having a pn junction plane at a position capable of absorbing light of a blue wavelength region and a photodiode for red light having a pn junction plane at a position capable of absorbing light of a red wavelength region, and the photoelectric conversion layer of the photoelectric conversion portion is able to absorb light of a green wavelength region.

6. The sensor according to claim 3, wherein the intra-substrate photoelectric conversion portion includes a plurality of photodiodes that is arranged in a vertical direction to an entering direction of incident light within the semiconductor substrate and that is capable of absorbing light having different colors.

7. The sensor according to claim 6, wherein the number of the photoelectric conversion portion stacked above the semiconductor substrate is one, the plurality of the photodiodes includes a photodiode for blue light having a pn junction plane at a position capable of absorbing light of a blue wavelength region and a photodiode for red light having a pn junction plane at a position capable of absorbing light of a red wavelength region, and the photoelectric conversion layer of the photoelectric conversion portion is able to absorb light of a green wavelength region.

8. A solid-state imaging device comprising:

a plurality of sensors according to claim 1 arranged in an array form; and a signal read-out portion that reads out signals each corresponding to a charge accumulated in each charge accumulating portion of each of the plurality of photoelectric conversion elements.

9. The sensor according to claim 1, wherein the organic high molecular polymer is a polycarbonate or polycarbonates.

* * * * *